US012356573B2

(12) United States Patent
Ngoc-Tran

(10) Patent No.: US 12,356,573 B2
(45) Date of Patent: Jul. 8, 2025

(54) CAMERA DEVICE WITH AN ADJUSTABLE STAND

(71) Applicant: Google LLC, Mountain View, CA (US)

(72) Inventor: Cindy Au Ngoc-Tran, San Jose, CA (US)

(73) Assignee: Google LLC, Mountain View, CA (US)

( * ) Notice: Subject to any disclaimer, the term of this patent is extended or adjusted under 35 U.S.C. 154(b) by 154 days.

(21) Appl. No.: 18/027,309

(22) PCT Filed: Aug. 2, 2021

(86) PCT No.: PCT/US2021/044208
§ 371 (c)(1),
(2) Date: Mar. 20, 2023

(87) PCT Pub. No.: WO2022/060476
PCT Pub. Date: Mar. 24, 2022

(65) Prior Publication Data
US 2023/0363101 A1 Nov. 9, 2023

Related U.S. Application Data

(63) Continuation of application No. 17/026,883, filed on Sep. 21, 2020, now Pat. No. 11,659,677.

(51) Int. Cl.
*H05K 7/14* (2006.01)
*F16M 11/04* (2006.01)
(Continued)

(52) U.S. Cl.
CPC ......... *H05K 7/1417* (2013.01); *F16M 11/041* (2013.01); *F16M 11/14* (2013.01);
(Continued)

(58) Field of Classification Search
CPC ...... F16M 11/041; F16M 11/14; F16M 13/02; F16M 13/022; F16M 13/027;
(Continued)

(56) References Cited

U.S. PATENT DOCUMENTS 11,659,677 B2  5/2023  Kwan et al.
11,968,795 B2  4/2024  Kwan
(Continued)

FOREIGN PATENT DOCUMENTS

CN  101594462  12/2009
CN  102620123  8/2012
(Continued)

OTHER PUBLICATIONS

"Examination Report", AU Application No. 2021345477, Mar. 18, 2024, 2 pages.
(Continued)

*Primary Examiner* — Antoinette T Spinks
(74) *Attorney, Agent, or Firm* — Colby Nipper PLLC

(57) ABSTRACT

The present document describes a camera device with an adjustable stand. The camera device includes a head assembly and a stand assembly pivotally connected together by a stem forming a hinge. The stem provides a 360-degree range of pan and a 45-degree range of tilt of the head assembly relative to the stand assembly. The stand assembly is rotatably movable relative to the head assembly to configure the camera device in different configuration states, including a tabletop state and a wall state. The tabletop state has a low profile for resting on a horizontal surface, and the wall state has a high profile, which provides additional clearance between the head assembly and a vertical surface to which the stand assembly is affixed. In the wall state, a cable of the camera device can be routed through and constrained by the stand assembly.

20 Claims, 16 Drawing Sheets

(51) Int. Cl.
- *F16M 11/14* (2006.01)
- *F16M 13/02* (2006.01)
- *G03B 17/56* (2021.01)
- *G08B 13/196* (2006.01)
- *H01Q 1/24* (2006.01)
- *H01Q 9/04* (2006.01)
- *H04N 23/51* (2023.01)
- *H04N 23/52* (2023.01)
- *H04N 23/54* (2023.01)
- *H04N 23/57* (2023.01)
- *H05K 7/20* (2006.01)

(52) U.S. Cl.
CPC .......... *F16M 13/02* (2013.01); *F16M 13/022* (2013.01); *F16M 13/027* (2013.01); *G03B 17/561* (2013.01); *G08B 13/19617* (2013.01); *H01Q 1/24* (2013.01); *H01Q 9/0407* (2013.01); *H04N 23/51* (2023.01); *H04N 23/52* (2023.01); *H04N 23/54* (2023.01); *H04N 23/57* (2023.01); *H05K 7/2039* (2013.01); *G08B 13/19654* (2013.01)

(58) Field of Classification Search
CPC ............ G03B 17/561; G08B 13/19617; G08B 13/19654; H01Q 1/24; H01Q 9/0407; H04N 23/51; H04N 23/52; H04N 23/54; H04N 23/57; H05K 7/1417; H05K 7/2039

See application file for complete search history.

(56) References Cited

U.S. PATENT DOCUMENTS

| | | |
|---|---|---|
| 2016/0205465 A1 | 7/2016 | Slotte et al. |
| 2018/0249483 A1 | 8/2018 | Chen |
| 2018/0259832 A1 | 9/2018 | Chen et al. |
| 2018/0343402 A1 | 11/2018 | Roth et al. |
| 2019/0004401 A1 | 1/2019 | Wilson et al. |
| 2019/0082371 A1 | 3/2019 | Burt et al. |
| 2020/0374970 A1 | 11/2020 | Wang et al. |
| 2022/0006493 A1 | 1/2022 | Wang et al. |
| 2022/0095472 A1 | 3/2022 | Kwan et al. |
| 2023/0262918 A1 | 8/2023 | Kwan et al. |

FOREIGN PATENT DOCUMENTS

| | | | |
|---|---|---|---|
| CN | 204425472 | | 6/2015 |
| CN | 206542527 | U | 10/2017 |
| CN | 206743456 | U | 12/2017 |
| CN | 210469525 | | 5/2020 |
| CN | 213094291 | | 4/2021 |
| EP | 3407591 | | 11/2018 |
| JP | 2020521397 | A | 7/2020 |
| KR | 20020064853 | A * | 8/2002 |
| WO | 1994003377 | | 2/1994 |
| WO | 2022060476 | | 3/2022 |

OTHER PUBLICATIONS

"Foreign Office Action", TW Application No. 112113296, Feb. 22, 2024, 15 pages.
"Foreign Office Action", EP Application No. 21192698.5, Mar. 15, 2024, 5 pages.
"Notice of Allowance", U.S. Appl. No. 18/299,597, filed Dec. 27, 2023, 12 pages.
"Foreign Office Action", EP Application No. 21192698.5, Oct. 16, 2023, 4 pages.
"International Preliminary Report on Patentability", Application No. PCT/US2021/044208, Mar. 21, 2023, 8 pages.
"Extended European Search Report", EP Application No. 21192698. 5, Mar. 4, 2022, 8 pages.
"Foreign Office Action", TW Application No. 110141072, May 10, 2022, 6 pages.
"International Search Report and Written Opinion", Application No. PCT/US2021/044208, Nov. 15, 2021, 10 pages.
"Non-Final Office Action", U.S. Appl. No. 17/026,883, filed Oct. 17, 2022, 13 pages.
"Notice of Allowance", U.S. Appl. No. 17/026,883, filed Feb. 2, 2023, 12 pages.
"Sonos Bulb UCSB Capstone Project", UC Santa Barbara Engineering, Accessed online at: https://web.ece.ucsb.edu/Faculty/Johnson/ECE189/final/bulb.pdf on Sep. 17, 2020, Jun. 2, 2016, 54 pages.
"Foreign Office Action", CA Application No. 3193106, Jun. 27, 2024, 3 pages.
"Foreign Office Action", JP Application No. 2023-518268, Aug. 6, 2024, 5 pages.

* cited by examiner

Section 4-4

Section 12B–12B

Section 15C-15C

CAMERA DEVICE WITH AN ADJUSTABLE STAND

RELATED APPLICATION(S)

This application is a national stage entry of International Application No. PCT/US2021/044208, filed Aug. 2, 2021, which claims the benefit of U.S. application Ser. No. 17/026,883, filed Sep. 21, 2020, the disclosures of which are incorporated herein by reference in their entirety.

BACKGROUND

As technology evolves, maintaining a low cost of production of an electronic device may be challenging. In some cases, reducing the production cost may include reducing the complexity of a device's components and/or the number of steps used in the assembly process. Some devices with a small form factor have limited available space within a housing for operators and tools to assemble internal components. In regards to camera devices (e.g., webcam, security cameras), different components may be needed to mount the camera device to different surfaces, including a shelf or a wall. Consequently, there may be insufficient clearance or articulation of the camera when mounted on a particular surface. One solution is to provide additional components for a user to switch out for mounting the device to a wall in comparison to placing the device on a horizontal surface. However, additional components may increase the manufacturing costs and, in some cases, diminish the user experience by requiring assembly by the user and introducing the potential of lost components.

SUMMARY

The present document describes a camera device with an adjustable stand. The camera device includes a head assembly and a stand assembly pivotally connected together by a stem forming a hinge. The stem provides a 360-degree range of pan and a 45-degree range of tilt of the head assembly relative to the stand assembly. The stand assembly is rotatably movable relative to the head assembly to configure the camera device in different configuration states, including a tabletop state and a wall state. The tabletop state has a low profile for resting on a horizontal surface, and the wall state has a high profile, which provides additional clearance between the head assembly and a vertical surface to which the stand assembly is affixed. In the wall state, a cable of the camera device can be routed through and constrained by the stand assembly.

In some aspects, an electronic device is disclosed. The electronic device may include a head assembly, a stem, and a stand assembly. The head assembly may include a rear housing member and a front housing member. The rear housing member may form a general cup shape that is generally symmetrical about a first central axis and has an open end and a rounded cap opposite the open end. The rear housing member may also have a tapering diameter that tapers from the open end to the rounded cap. The front housing member may be assembled at the open end of the rear housing member to cover the open end. The front housing member may have a general disk-like shape and be aligned with a camera lens of a camera of the electronic device located within the rear housing member. The stem may have an elongated and cylindrical shaft with opposing first and second ends. The first end of the stem may be attached to the head assembly through a hole located on a lateral side of the rear housing member and proximate to the open end of the rear housing member. The first end of the stem may also form a hinge with the head assembly to enable pivotal movement of the head assembly relative to the stem. The stand assembly may have a domed shape that is generally symmetrical about a second central axis and may also have a substantially planar bottom surface. The stand assembly may be attached to the second end of the stem at a location on the stand assembly that is offset from the second central axis of the stand assembly to cause the stem to form a non-orthogonal angle with the second central axis of the stand assembly.

In other aspects, a camera device is disclosed. The camera device may include a head assembly and a stand assembly. The head assembly includes a rear housing member, a front housing member, and a camera subassembly. The rear housing member has a general cup shape with an open end and an opposing, rounded, closed end. The front housing member has a generally disk-like shape and is configured to cover the open end of the head assembly. The camera subassembly is positioned within the rear housing member and aligned with an aperture or transparent region in the front housing member to enable capture of images or video of a scene. The stand assembly includes a base housing member forming a dome-shaped shell and a weight block positioned within the base housing member. The stand assembly also includes a stem configured to provide a hinge connecting the stand assembly to the head assembly. The stem is also configured to substantially provide a 45-degree range of tilt and a 360-degree range of pan of the head assembly relative to the stand assembly. In an example, the rear housing member has a cup shape, and the front housing member has a disk-like shape. In this example, the stem is also configured to provide a 45-degree range of tilt and a 360-degree range of pan of the head assembly relative to the stand assembly. Also, the open end of the head assembly can be the open end of the rear housing member. Therefore, in an example, the front housing member covers the open end of the rear housing member.

In yet other aspects, a camera device is disclosed. The camera device includes a head assembly, a stand assembly, and a hinge pivotally connecting the head assembly to the stand assembly. The head assembly has at least a camera subassembly for capturing images of a scene. The stand assembly is configured to support the head assembly and mount to a surface. The hinge is configured to provide 360-degree range of pan of the head assembly relative to the stand assembly. The hinge is also configured to enable multiple configuration states for affixing the camera device to different surfaces, where the multiple configuration states including a tabletop state for a substantially horizontal surface and a wall state for a substantially vertical surface. In addition, the hinge is configured to transition between the tabletop state and the wall state based on an approximate 180-degree rotation of the stand assembly about a longitudinal axis of the hinge and relative to the head assembly. In an example, the hinge can also be configured to: enable multiple configuration states for affixing the camera device to different surfaces, the multiple configuration states including a tabletop state for a horizontal surface and a wall state for a vertical surface; and transition between the tabletop state and the wall state based on a 180-degree rotation of the stand assembly about a longitudinal axis of the hinge and relative to the head assembly.

In yet other aspects, a stand assembly for a camera device is disclosed. In an example, the stand assembly can be included in the camera device as described herein. The stand assembly includes a housing, a base plate, and a base cap. The base plate is positioned within the housing and has a general cup shape with an open end and a substantially planar closed end. The base plate includes multiple protrusions distributed around a rim of the open end. The base cap is positioned within the housing and has multiple channels configured to receive the protrusions on the base plate. The multiple channels include first and second channels that are substantially parallel to one another and offset from one another in a direction orthogonal to a longitudinal direction of the at least two channels. The first channel enables a low profile for the stand assembly, and the second channel enables a high profile for the stand assembly.

This summary is provided to introduce simplified concepts of a camera device with an adjustable stand, which is further described below in the Detailed Description. This summary is not intended to identify essential features of the claimed subject matter, nor is it intended for use in determining the scope of the claimed subject matter.

BRIEF DESCRIPTION OF THE DRAWINGS

The details of one or more aspects of a camera device with an adjustable stand are described in this document with reference to the following drawings. The same numbers are used throughout the drawings to reference like features and components.

DETAILED DESCRIPTION

This document describes a camera device (e.g., security camera) with an adjustable stand. The camera device described herein has improved robustness, simplicity, and compactness compared to many conventional camera devices with stands. The camera device can be configured in multiple different configuration states with different articulations. In addition, the camera device includes an adjustable stand assembly that is pivotally connected to a head assembly and rotatably movable relative to the head assembly to switch between the multiple different configuration states. For example, one configuration state may include a tabletop state in which the camera device may rest on a table, a shelf, or another horizontal surface. If the user rotates the stand assembly relative to the head assembly by approximately 180 degrees, the camera device is then configured in a wall state and may be affixed to a wall. In this way, no extra components are required to switch between a tabletop state and a wall state.

In addition, the stand assembly includes an adjustable height to provide a low profile in the tabletop state and a high profile in the wall state. The high profile of the wall state provides additional clearance between the head assembly and the wall to prevent the head assembly from touching the wall. The height of the stand assembly can be adjusted based on a twist lock connection between a base plate and a base cap positioned within a housing of the stand assembly. The base plate includes notches on opposing sides of the base plate, and the high profile of the wall state provides a volume between the base plate and the base cap. Accordingly, in the wall state, a cable of the camera device can be routed through the notches and the volume, which hides and constrains a portion of the cable.

While features and concepts of the described camera device with an adjustable stand can be implemented in any number of different environments, aspects are described in the context of the following examples.

Example Device

Figure 1:
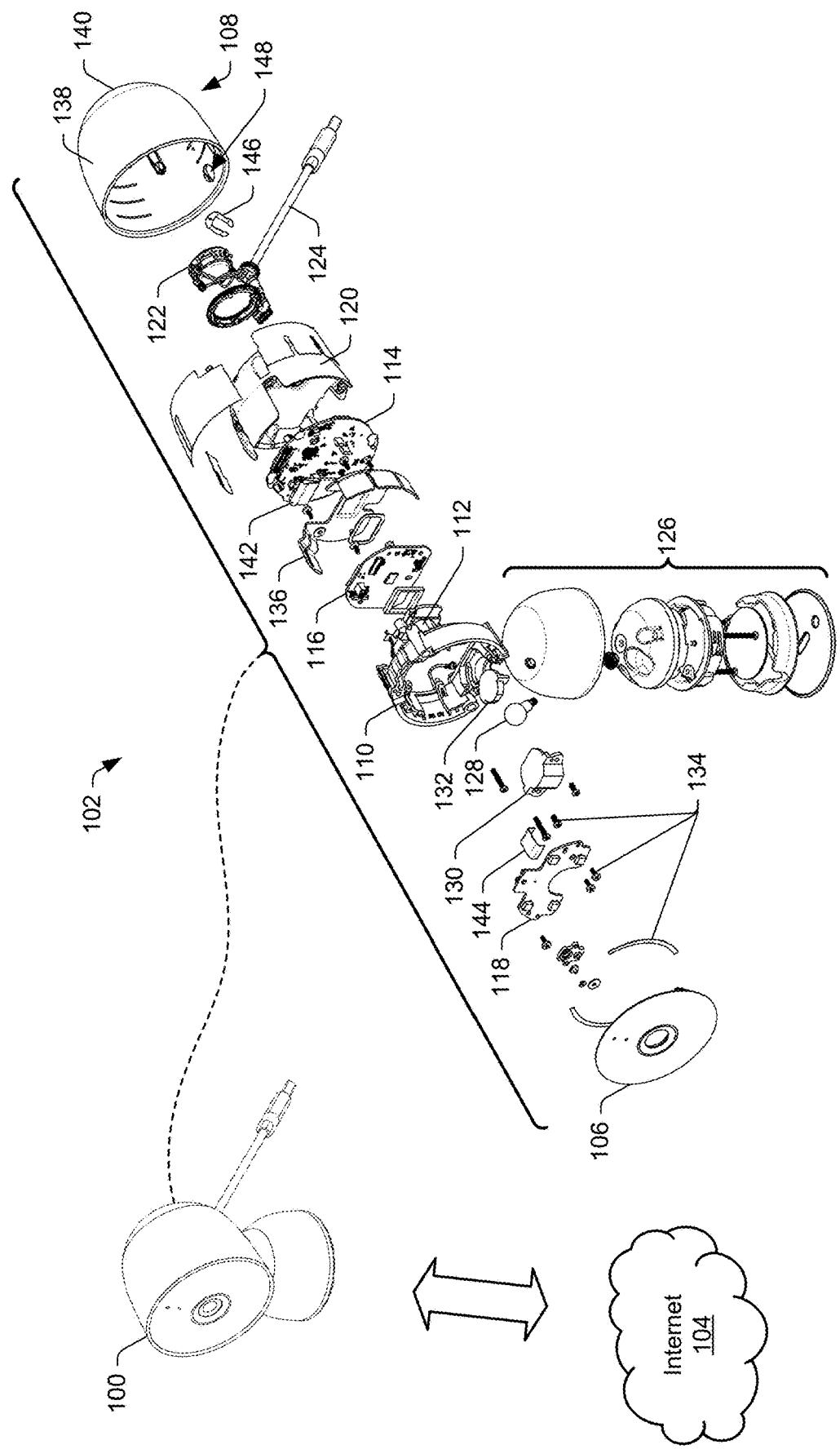
FIG. 1 illustrates an example electronic device and an exploded view of some components thereof.
Figure 2:
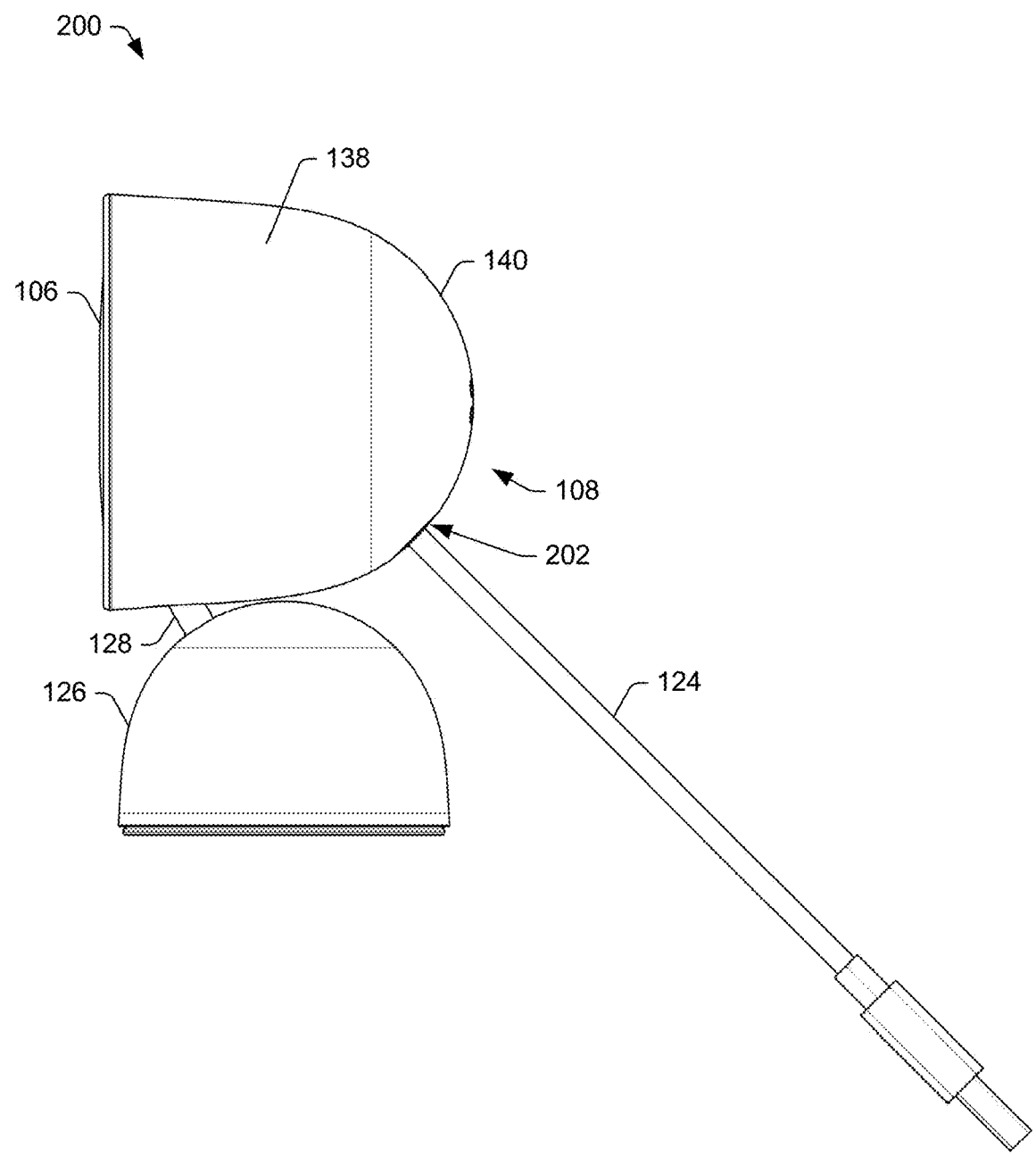
FIG. 2 illustrates an example right elevational view of the electronic device from FIG. 1.
Figure 3:
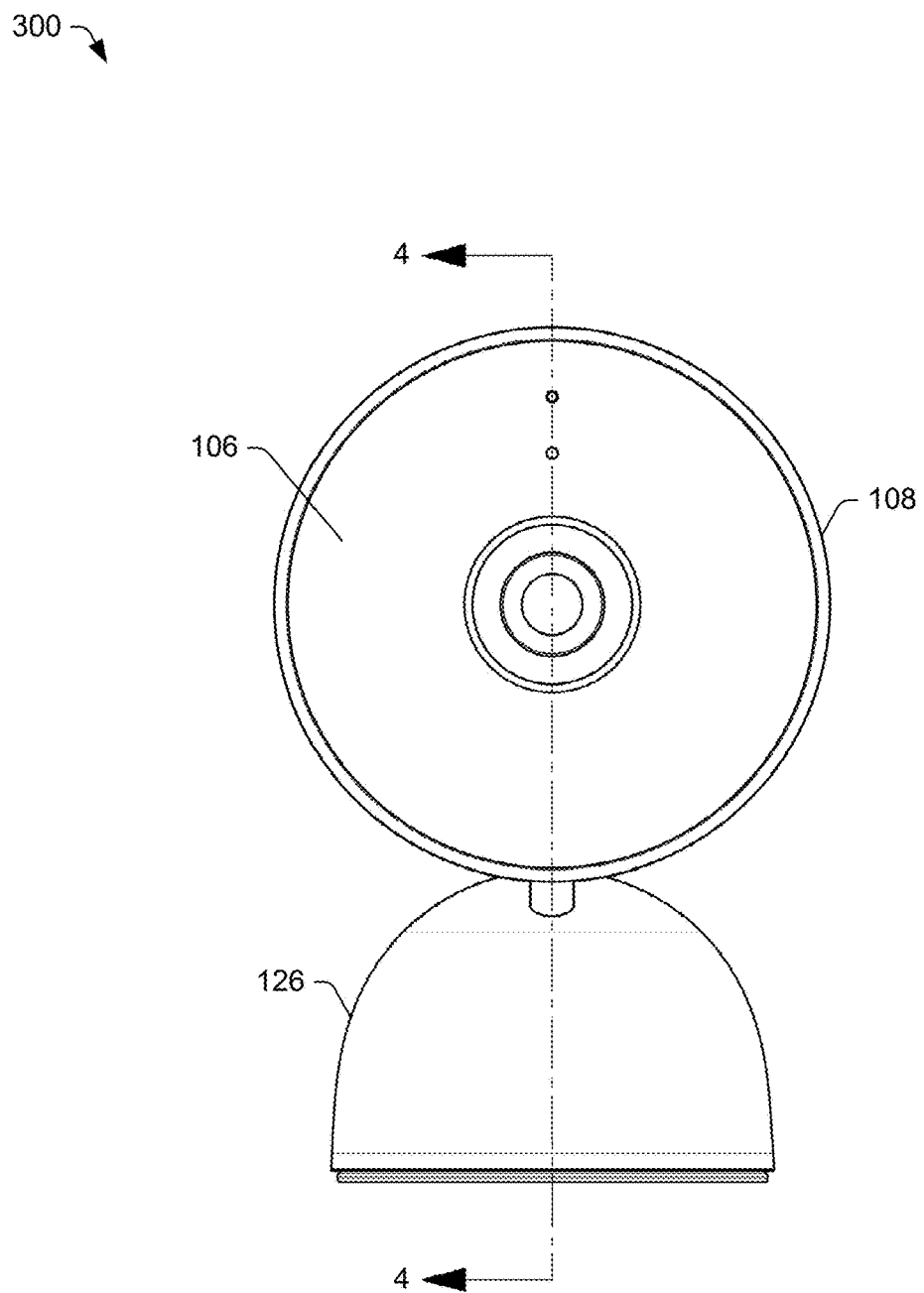
FIG. 3 illustrates a front elevational view of the electronic device from FIG. 1.
Figure 4:
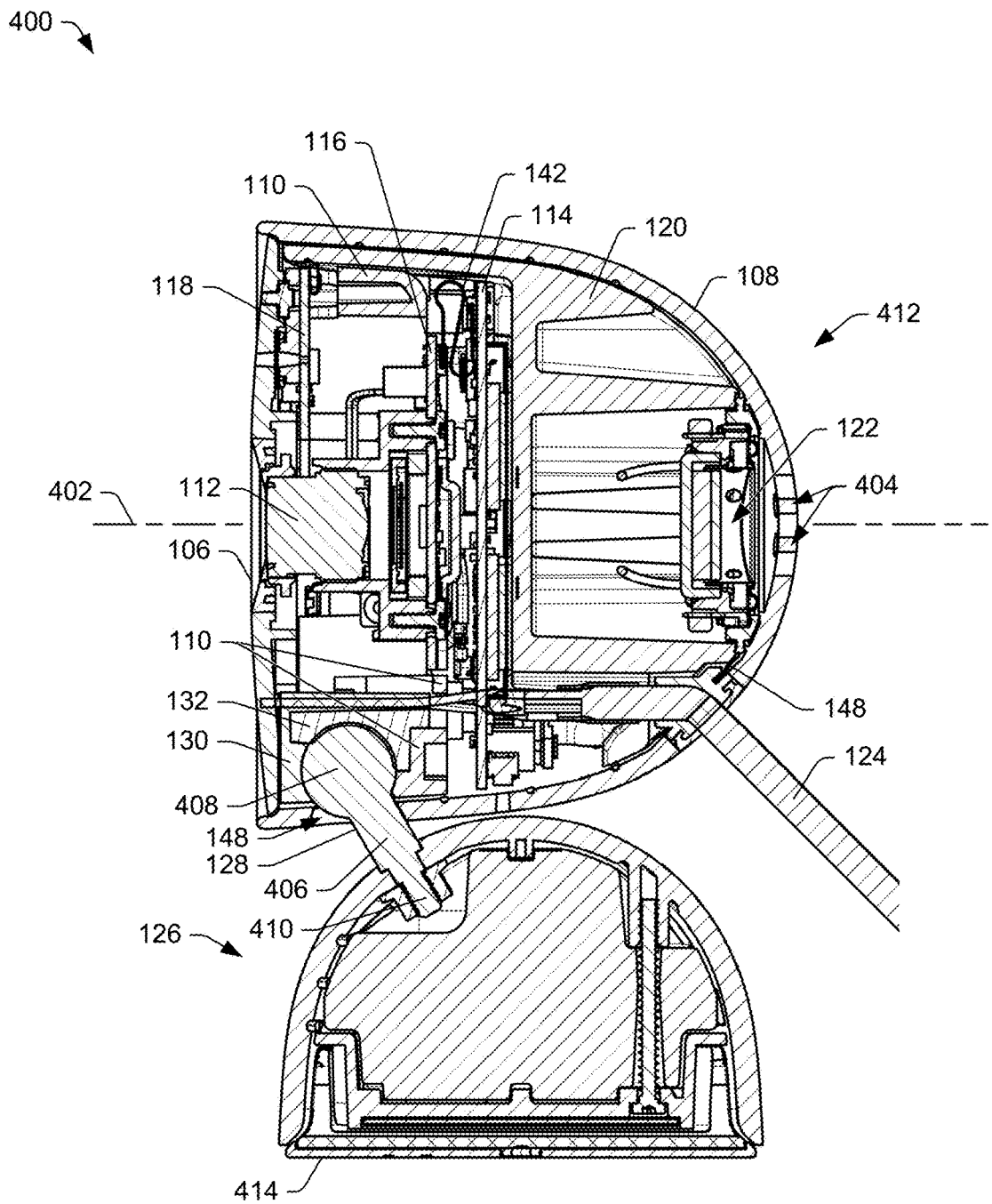
FIG. 4 illustrates a sectional view of the electronic device from FIG. 3, taken along line 4-4.

FIG. 1 illustrates an example electronic device 100 (e.g., a security camera) and an exploded view 102 of some components thereof. FIG. 2 illustrates an example right elevational view 200 of the electronic device from FIG. 1. FIG. 3 illustrates a front elevational view 300 of the electronic device from FIG. 1. FIG. 4 illustrates a sectional view 400 of the electronic device from FIG. 3, taken along line 4-4. In the following, reference may be made to various components or parts of the electronic device 100 illustrated in any of FIGS. 1-4.

The electronic device 100, in some aspects, may use a voice-activated virtual assistant. The electronic device 100 may connect to the Internet 104 (e.g., through a wireless router) and support a variety of functions, including capturing audio and/or video data (including images or streaming video), transmitting the captured data to online storage, storing the captured data to local memory, streaming audio (e.g., music, news, podcasts, sports), and interacting with a virtual assistant to perform tasks (e.g., search the internet, schedule events and alarms, control home automation, control internet-of-things (IoT) devices), and so on.

The electronic device 100 includes a housing formed by one or more housing members, including a front housing member 106 (e.g., a front cover) and a rear housing member 108, a structural midframe 110 (also referred to as the midframe 110), a camera subassembly 112, and multiple printed circuit boards (PCBs) including at least a main logic board (MLB) 114, a camera board 116, and an infrared (IR) board 118. Additional PCBs may also be used. The PCBs may include various integrated circuit (IC) components, including system-on-chip (SoC) IC devices, processors, and IC components for light-emitting diode(s) (LEDs), microphone(s), or sensors for detecting input such as touch-input, a button-press, or a voice command. The electronic device 100 also includes a heatsink 120, a speaker module 122, and a cable 124 (e.g., power cable). The electronic device 100 may also include a stand assembly 126. In some aspects, the electronic device 100 may include a hinge, such as a generally spherical ball joint formed by a stem 128 (e.g., ball stem), a bracket 130 (e.g., ball stem bracket), and a boot 132 (e.g., ball stem boot). The bracket 130 is mounted to the midframe 110 to secure the boot 132 and the stem 128 in place. In particular, the bracket 130 is configured to constrain a front half of the boot 132 to control a friction interface. The boot 132 is configured to compress against a spherical end of the stem 128 to create friction. The midframe 110 includes a hinge-bearing surface (e.g., a concave surface) forming an inverse of a portion of a sphere that is truncated to form a substantial C-shape. In this way, the midframe 110 may interface with the spherical end of the stem 128.

The electronic device 100 may further include removable assembly components, such as fasteners 134 (e.g., screws, bolts, adhesive, pressure-sensitive adhesive (PSA)). Along with the heatsink 120, the electronic device 100 may include one or more additional thermal-control components (e.g., heat spreader 136, thermal interface materials (TIMs) such as thermal gel, thermal paste, thermal adhesive, thermal tape) with high thermal conductivities.

The housing members 106 and 108 may include a plastic material and be formed, for example, using plastic-injection molding techniques. The housing members 106 and 108 may include any suitable geometry, including the example geometry illustrated in FIG. 1. For instance, the rear housing member 108 may form a shell 138 (e.g., a hollow cylinder or generally cylindrical shell) with a rounded cap 140 (e.g., a generally spherical cap) at one end of the cylinder. An example profile view of the rear housing member 108 is shown in FIG. 2, which illustrates a tapering diameter of the shell 138 that is capped at the back end by the cap 140. This leaves an opposing end of the shell 138 open. In this way, the rear housing member 108 forms a general cup shape with an open end and an opposing, rounded, closed end. Although the examples described herein illustrate a generally cylindrical shell and a generally spherical cap, alternate shapes may also be implemented for the shell and cap. For example, the rear housing member 108 may form an oblong shell or any other suitably shaped shell, with a cross-section having any suitable shape, including an oval shape, a square shape, a rectangular shape, a triangular shape, or an asymmetrical shape.

The rear housing member 108 defines a cavity for housing various components of the electronic device 100. In the illustrated example, the rear housing member 108 is a single, solid part, which is smooth (seamless) and cosmetically designed, but also enables manufacturing at low cost. Alternatively, the rear housing member 108 may include multiple parts assembled together. The front housing member 106 may have a generally disk-like shape and be configured to cover the open end (front) of the shell. The front housing member 106 may assemble to the midframe 110 via any suitable fastener or combination of fasteners, including PSA, one or more clips or snaps, screws, bolts, and so forth. The front housing member 106 may also include an aperture or transparent region that is aligned with the camera subassembly 112 to enable the camera subassembly 112 to view through the aperture or transparent region and capture images or video of a scene.

The structural midframe 110 is configured to be slidably inserted into the rear housing member 108 and form a structural frame for the electronic device 100. In aspects, the structural midframe 110 is formed such that a majority of the internal components of the electronic device 100 are assembled to the midframe 110, rather than to the housing. The internal components of the electronic device 100 can be assembled to the midframe 110 to create a midframe subassembly outside of the housing. This midframe subassembly can be tested prior to enclosing the assembled components within the housing, which allows modifications, adjustments, and repairs to be performed without risking damage to the housing via disassembly. Because the majority of the components of the electronic device 100 are assembled (e.g., mounted) to the midframe 110, the housing can be formed with a geometry that can be molded cosmetically at low cost. The midframe 110 may be formed using any suitable technique, such as injection molding using any suitable material, such as a polycarbonate material (e.g., 75% post-consumer recyclable polycarbonate, 95% post-consumer recyclable polycarbonate) or other thermoplastic polymer. The midframe 110 may also include a region forming a portion of a hinge. For example, the region may include an inverse of a generally spherical ball joint. Such a region of the midframe 110 may provide a hard contact surface to prevent wiggle or other movement of the spherical end of the stem 128 in the boot 132 and create a more stable-feeling hinge.

Turning to FIG. 4, the camera subassembly 112 may capture images within a field of view of the electronic device 100 and may be mounted to the midframe 110. In some aspects, the camera subassembly 112 may be concentrically mounted to the midframe 110 such that the camera subassembly 112 is positioned within a perimeter of the midframe 110 and is positioned coaxially or shares a center axis (e.g., axis 402) with the midframe 110. Returning to FIG. 1, the camera subassembly 112 may be mounted to a first side of the camera board 116, which is opposite a second side of the camera board 116 to which the main logic board 114 may be electrically connected. In some implementations, the heat spreader 136 may be positioned between the camera board 116 and the main logic board 114. As illustrated in FIG. 4, the camera subassembly 112 is positioned proximate to a front of the electronic device 100 and may abut the front housing member 106, which includes an aperture or transparent portion aligned with the camera subassembly 112 to enable the camera subassembly 112 to capture images and/or video of a scene within its field of view.

The PCBs (e.g., the main logic board 114, the camera board 116, the IR board 118) shown in FIG. 1 may be formed, for example, from glass-reinforced epoxy material such as FR4. In some instances, the PCBs may include a single layer of electrically conductive traces and be a single-layer board. In other instances, the PCBs may be a multi-layer board that includes multiple layers of electrically conductive traces that are separated by layers of a dielectric material. As illustrated in FIG. 4, each of the PCBs may be mounted to the midframe 110, either directly or indirectly (e.g., mounted to another component that is assembled to the midframe). Accordingly, the PCBs are mounted to the midframe 110 and not mounted to the housing. In the example shown in FIG. 1, each of the PCBs is to be mounted directly to the midframe 110.

Returning to FIG. 1, the main logic board 114 may be assembled to the midframe 110 proximate to a rear opening of the midframe 110 that opens toward a rear of the electronic device 100 (e.g., proximate to the cap 140 of the rear housing member 108). In aspects, the main logic board 114 may be positioned between the heatsink 120 and the midframe 110. Also, the main logic board 114 may be positioned between the heatsink 120 and the heat spreader 136. The main logic board 114 may be electrically connected to the camera board 116, e.g., via a flexible printed circuit (FPC) 142 and separated from the camera board 116 by the heat spreader 136.

The camera board 116 may be assembled to the midframe 110 proximate to the rear opening of the midframe 110 and within an interior of the midframe 110. The camera board 116 may be connected to the camera subassembly 112. In addition, the camera board 116 may be electrically connected to the IR board 118, e.g., via a flexible flat cable (FFC) 144. The camera board 116 may be positioned between the camera subassembly 112 and the main logic board 114. Also, the camera board 116 may be positioned between the heat spreader 136 and the midframe 110.

The IR board 118 may be assembled to the midframe 110 and include circuitry to manage various functionality, including motion detection within the field of view of the electronic device 100 and/or facial detection of a face in the field of view. In an example, the IR board 118 may be mounted to the midframe 110 using one or more fasteners, including screws. The IR board 118 may be electrically connected to an IR illuminator and IR sensor, which may be usable for the motion detection or the facial recognition. The IR board 118 may be mounted proximate to a front opening of the midframe 110 that is open toward a front of the electronic device 100 (e.g., proximate to the front housing member 106) such that the camera board 116 is between the IR board 118 and the heat spreader 136.

The heatsink 120 and the heat spreader 136 may be implemented to transfer and spread energy from heat-dissipating components on the PCBs, including SoC IC devices, memory devices, processors, and so forth. The heat spreader 136 may be positioned between the main logic board 114 and the camera board 116 to transfer and spread heat generated by one or more heat-generating IC components (e.g., SoC IC component, memory IC components, audio amplifiers, and audio inductors) on the main logic board 114 and/or on the camera board 116. The heatsink 120 may be positioned on an opposing side of the main logic board 114 from the midframe 110 to transfer and spread heat generated by one or more heat-generating IC components on the main logic board 114 toward a back end and lateral sides of the electronic device 100. The main logic board 114 may include a shielding cover that shields IC components mounted on the main logic board 114. The shielding cover may be mounted on a first side of the main logic board 114 that is opposite a second side that faces the heat spreader 136. Thermal interface material may be dispensed onto the shielding cover to distribute heat generated by the IC components on the main logic board 114 to the heatsink 120.

The speaker module 122 may be assembled to the heatsink 120 and positioned such that the heatsink 120 is between the speaker module 122 and the midframe 110. In this way, the speaker module 122 may output audio waves toward a back side of the electronic device 100 (e.g., toward the cap 140 of the rear housing member 108). Referring to FIG. 4, the cap 140 of the rear housing member 108 may include one or more holes 404 (e.g., perforations) aligned with the speaker module 122 to provide a path for the audio waves to exit the housing. The speaker module 122 may be electrically connected to the main logic board 114 via one or more wires passing through or around the heatsink 120.

Returning to FIG. 1, the cable 124 may be assembled to the main logic board 114. As illustrated in FIG. 2, the cable 124 may be positioned to longitudinally extend through a hole in the rear housing member 108, such as a hole 202 in the cap 140. Returning to FIG. 1, the cable 124 may be assembled with a clip 146, which resists longitudinal movement of the cable 124 through the hole 202 in the rear housing member 108 from within the cavity toward the outside of the rear housing member 108. During assembly, for example, a portion of the cable 124 may be inserted through the hole 202 in the rear housing member 108 from outside of the rear housing member 108 and into the cavity. The cable 124 is overextended through the hole 202 and also through the open end of the rear housing member 108 to enable assembly of the cable 124 to the main logic board 114 outside of the rear housing member 108 (e.g., beyond the open end of the rear housing member 108). Subsequent to assembling the cable 124 to the main logic board 114, which is assembled to the midframe 110, the cable 124 is moved in the opposite direction through the hole 202 to partially exit the cavity. The clip 146 retains a portion of the cable 124 in the cavity by preventing the cable 124 from exiting the rear housing member 108 beyond a location at which the clip 146 engages the cable 124. The rear housing member 108 may include an additional hole (e.g., hole 148), which may enable the stem 128 to extend through to the stand assembly 126. In aspects, the hole 148 is located on a lateral side of the rear housing member 108 and proximate to the open end of the rear housing member 108.

In aspects, the rear housing member 108 and the components assembled therein may be referred to as a head or a head assembly 412 of the electronic device 100. The stand assembly 126 may be referred to as a base of the electronic device 100. The base and the head are pivotally connected via the hinge. In aspects, the stand assembly 126 has a domed shape. Also, the stand assembly has a smaller diameter than that of the head assembly 412.

The stand assembly 126 may include a variety of components assembled together to support the electronic device 100. In the example illustrated in FIG. 4, the stand assembly 126 may be connected to the stem 128 of the hinge. The stem 128 includes an elongated and cylindrical shaft 406, a first end 408 (e.g., spherical end), and a second end 410 (e.g., threaded end) on an opposing end of the shaft 406 from the first end 408. The shaft 406 is inserted through the hole 148 in the rear housing member 108, and the first end 408 is positioned between the midframe 110, the boot 132, the bracket 130, and the rear housing member 108. In this way, the first end 408 of the stem 128 is secured within the head assembly 412 and the head assembly 412 is pivotally movable relative to the stem 128. The stand assembly 126 includes a bottom surface 414 that may be mounted or assembled to any suitable surface, such as a wall, a table, or a ceiling to support the electronic device 100. The bottom surface 414 may be substantially planar with an elliptical shape. In aspects, the bottom surface 414 may have a diameter that is less than a diameter of the front housing member 106. Further, the stand assembly 126 may be removably connected to the stem 128 of the hinge. The first end 408 forms a hinge with the head assembly 412 and enables pivotal movement of the head assembly 412 relative to the stem 128 (and/or relative to the stand assembly 126). In some aspects, the pivotal movement of the head assembly 412 is bounded by the perimeter of the hole 148. Further, due to the spherical shape of the first end 408 of the stem 128, the pivotal movement of the head assembly 412 includes pan, tilt, or both pan and tilt.

Figure 5:
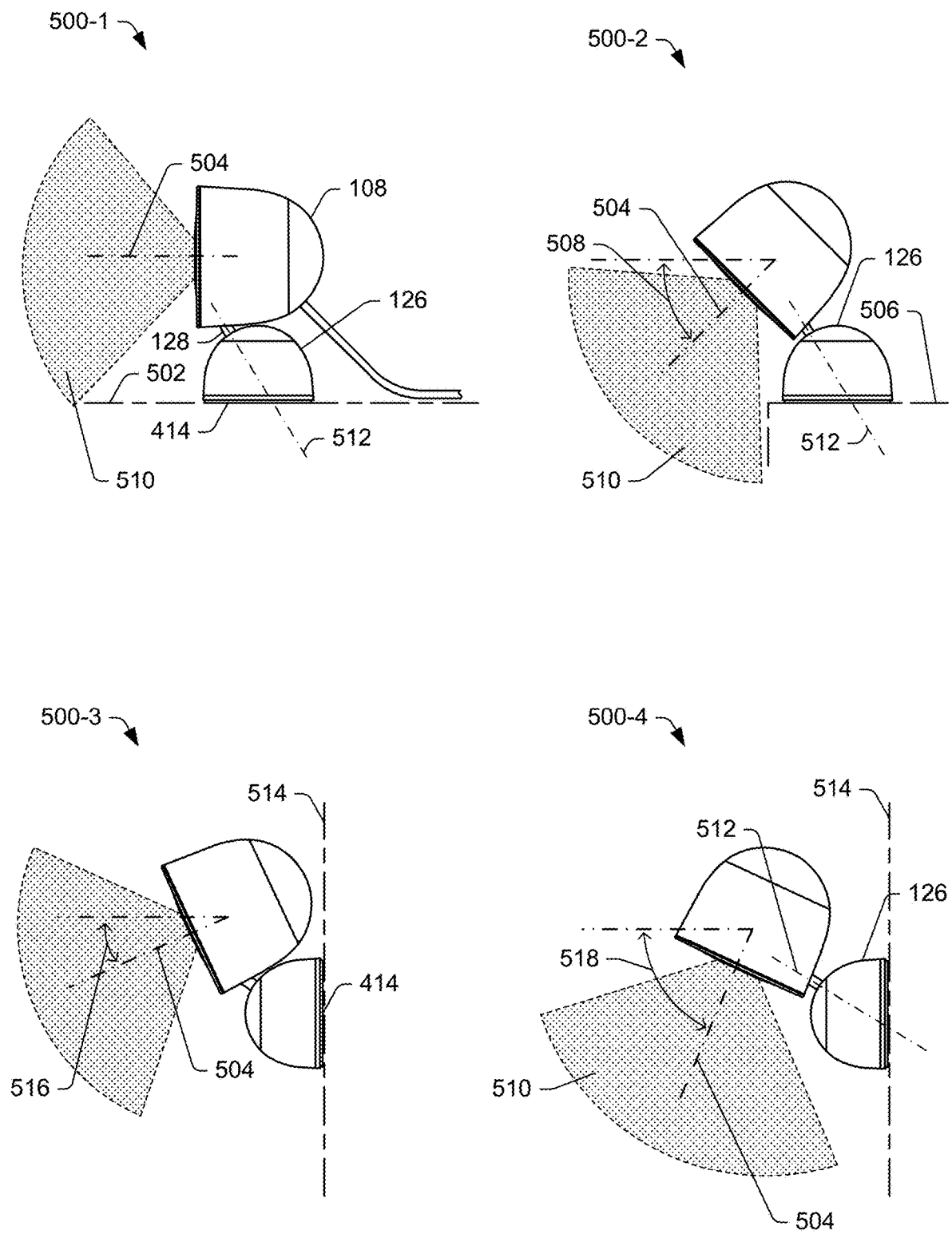
FIG. 5 illustrates example positions of a head assembly relative to the stand assembly in different mounting positions.

FIG. 5 illustrates example positions (e.g., positions 500-1, 500-2, 500-3, and 500-4) of a head assembly (e.g., the head assembly 412) relative to the base (e.g., the stand assembly 126) in different mounting positions. In the illustrated examples, the electronic device 100 is shown in a tabletop state (e.g., positions 500-1 and 500-2) and a wall state (e.g., positions 500-3 and 500-4). The head assembly 412 can articulate in each of the tabletop state and the wall state. The ability to articulate in both states provides flexibility for mounting the electronic device 100. By implementing the hinge (e.g., combination of the stem 128, the bracket 130, the boot 132, and the midframe 110) described herein, a user can rotate the stand assembly 126 relative to the head assembly 412 to convert from the tabletop state to the wall state and from the wall state to the tabletop state. Further, each of the tabletop and wall states enables sufficient articulation by providing an approximate (although not identical) 45-degree range of tilt and 360-degree range of pan.

In position 500-1, the stand assembly 126 is oriented to rest on a substantially horizontal surface 502 and the head assembly 412 is positioned in a substantially horizontal orientation. The position 500-1 may be used when the electronic device 100 is placed on, e.g., a tabletop, a countertop, or a desk, to enable the camera (e.g., camera subassembly 112 in FIG. 4) to face substantially horizontally. For example, the head assembly 412 may include a central axis 504 that is substantially aligned with (e.g., parallel to) a plane defined by the bottom surface 414 of the stand assembly 126. If the electronic device 100 is placed on a shelf (e.g., surface 506), the head assembly 412 can be pivotally moved to face downward at an angle 508. In the tabletop mounting position, the angle 508 may be substantially within a range of tilt of zero to 45 degrees below the plane defined by the bottom surface 414 of the base, which is substantially parallel to the surface 502 or the surface 506 (or a horizontal plane defined by the surface 502 or the surface 506). In this way, the head assembly 412 may be oriented to enable a field of view 510 of the camera subassembly 112 to include a volume directly below the camera subassembly 112 and in front of the shelf. Further, in the position 500-2, the central axis 504 of the head assembly 412 may be substantially orthogonal to a longitudinal axis (e.g., longitudinal axis 512) of the stem 128.

To transition the electronic device 100 into the wall state (e.g., wall mounting position), the base is rotated approximately 180 degrees relative to the head assembly 412 and about the longitudinal axis 512 of the stem 128, which enables the bottom surface 414 of the base to be substantially orthogonal to its previous position, due to the location at which the hinge connects the stand assembly 126 to the head assembly 412. As illustrated in positions 500-3 and 500-4, the electronic device 100 is oriented in the wall mounting position and is assembled to an inclined surface (e.g., a substantially vertical surface such as a wall 514). In the wall mounting position, the electronic device 100 may generally be placed at an elevated location, e.g., near a ceiling, above the scene and subject(s) within the scene. Because of this elevated location in the wall mounting position, the head assembly 412 may be pivotally moved to a greater angle below the horizontal plane in comparison to the tabletop mounting position. For example, the head assembly 412 is pivotally movable between angle 516 and angle 518, which may define a range of tilt of approximately 25 to 70 degrees below the horizontal plane when the stand assembly 126 is assembled to a vertical wall. In this way, the head assembly 412 may be oriented to enable the field of view 510 of the camera subassembly 112 to include a volume proximate to the wall 514 and below the stand assembly 126. There may be a small area (e.g., blind spot) below the stand assembly 126 that is outside the field of view 510 of the camera subassembly 112, but the hinge enables the head assembly 412 to be positioned relative to the base in a way that reduces the size of the blind spot.

Example Stand Assembly

Figure 6:
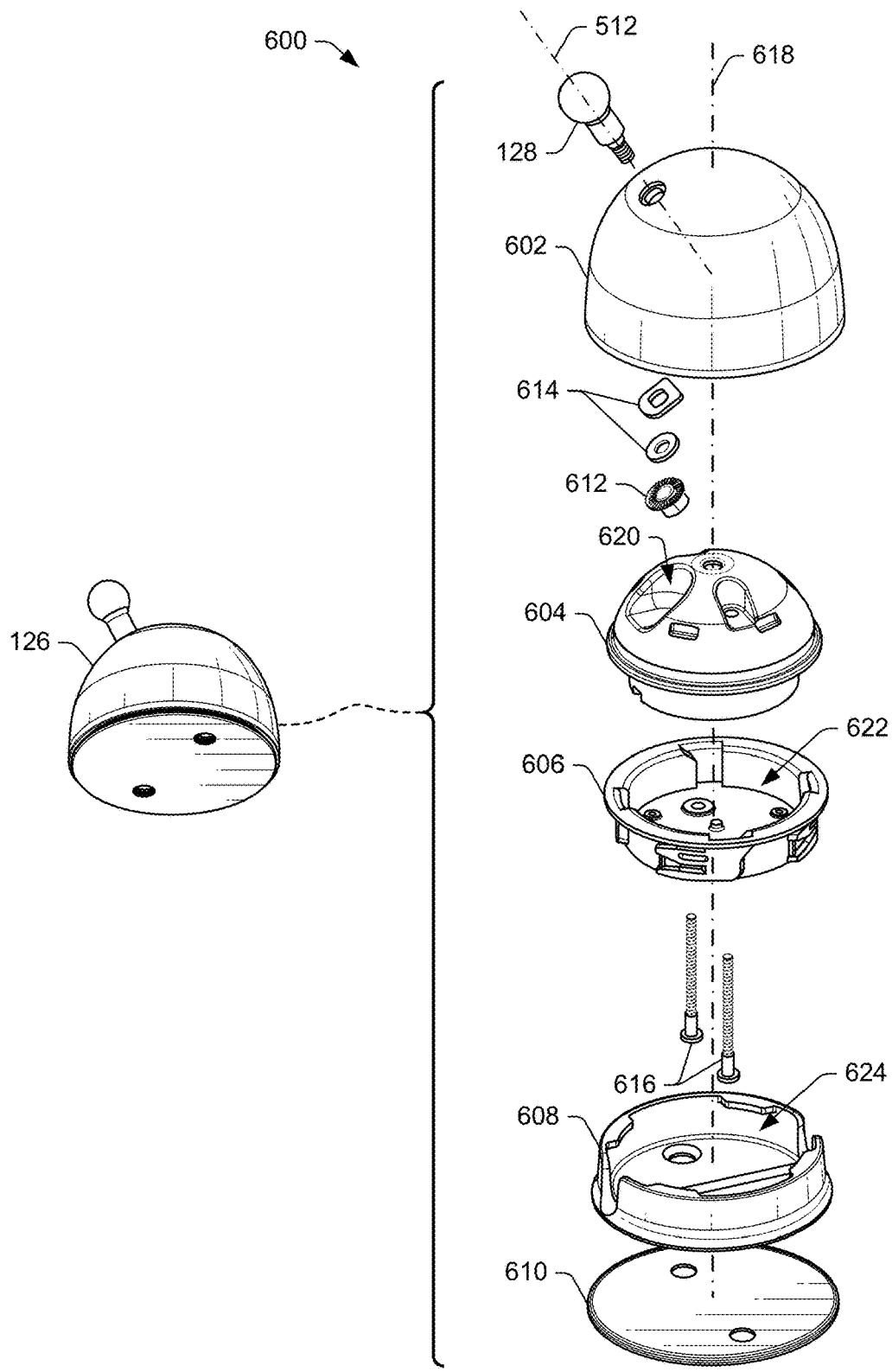
FIG. 6 illustrates the stand assembly of the electronic device from FIG. 1 and an exploded view thereof.

FIG. 6 illustrates the stand assembly 126 of the electronic device 100 from FIG. 1 and an example exploded view 600 thereof. The stand assembly 126 includes the stem 128, a base housing member 602, a weight block 604, a base cap 606, and a base plate 608. The stand assembly may also include a foot 610, which provides friction and support for resting on or mounting to a surface. In some aspects, the stem 128 may be mechanically attached to the base housing member 602 via a threaded fastener 612 (e.g., nut) and one or more washers 614. In addition, the base cap 606 may be mechanically secured to the weight block 604 via one or more fasteners 616 (e.g., screws).

The stem 128 acts as a hinge that enables full 360-degree rotation between the stand assembly 126 and the head (e.g., head assembly 412). The stem 128 is oriented such that the longitudinal axis 512 of the stem 128 intersects a central axis (e.g., central axis 618) of the stand assembly 126 and is non-orthogonal to the central axis 618. In an example, the longitudinal axis 512 of the stem 128 forms a non-orthogonal angle with the central axis 618 of the stand assembly 126 that is substantially within a range of 20 degrees to 50 degrees. Because the stem 128 is offset from the central axis 618 of the stand assembly 126, the hinge enables the stand assembly 126 to rotate approximately 180 degrees relative to the head assembly 412 and change an orientation of the bottom surface 414 (e.g., bottom surface of the foot 610) from a first orientation (e.g., horizontal plane) to a second orientation (e.g., vertical plane) that is approximately orthogonal to the first orientation (e.g., change the orientation of the stand assembly 126 relative to the head assembly 412 from the tabletop state to the wall state, or vice versa, as described in FIG. 5) while still enabling articulation of the head assembly 412 in the different orientations.

The stand assembly 126 forms a dome-shaped shell (e.g., the base housing member forms a general cup shape with an open end and an opposing, rounded, closed end). The domed shape of the stand assembly 126 is generally symmetrical about the central axis 618. The weight block 604 fits inside the base housing member 602 and is configured to provide stability to the electronic device 100, which enables the electronic device 100 to have a smaller form factor and a smaller footprint than many existing cameras. Accordingly, the weight block 604 acts as a counterweight to the head assembly 412 of the electronic device 100 for increased stability. In some implementations, the weight block 604 may be shaped to substantially complement an interior curvature of the base housing member 602. In addition, the weight block 604 may include one or more recesses (e.g., recess 620) configured to receive one or more components (e.g., threaded fastener 612, a threaded end of the stem 128).

In aspects, the threaded fastener 612 and the washers 614 are used to secure the stem 128 to the base housing member 602. In an example, the stem 128 is positioned within a hole in the base housing member 602 and is attached to the threaded fastener 612 within the base housing member 602. Accordingly, the stem 128 is attached to the base housing member 602 in this example. In other examples described herein, the stem 128 is secured or attached to the weight block 604.

The base cap 606 is configured to be attached to the weight block 604 on a side of the weight block 604 that is opposite the base housing member 602. In an example, the base cap 606 has a general cup shape (e.g., cylindrical shell) with a substantially planar closed end and an open end. The base cap 606 may be assembled to the weight block 604 in a manner that a portion of the weight block 604 is positioned within a cavity 622 formed by the base cap 606. When assembled together, the base cap 606 is positioned proximate to the open end of the base housing member 602, whereas the weight block 604 is positioned proximate to the closed end of the base housing member 602. In this arrangement, the weight block 604 is between the base housing member 602 and the base cap 606. In some aspects, the base cap 606 is attached to the weight block via one or more fasteners (e.g., the fasteners 616).

The base plate 608 is configured to be removably assembled to the base cap 606. The base plate 608 has a general cup shape (e.g., cylindrical shell) with an open end and a substantially planar closed end. The base plate 608 is assembled to the base cap 606 in a manner that a portion of the base cap 606 is positioned within a cavity 624 formed by the base plate 608. When assembled together, the base cap 606 is positioned between the base housing member 602 and the base plate 608.

As described herein, the base cap 606 includes features that enable attachment of the base plate 608 at two different locations, which affects an overall height of the stand assembly 126. The foot 610 is affixed to the bottom surface of the base plate 608. In aspects, the foot 610 is attached via adhesive. The foot 610 may be positioned proximate to the open end of the base housing member 602 such that the foot 610 is offset from being flush with the open end of the base housing member 602. The foot 610 may be formed of any suitable material, which provides friction against a surface for stability.

Figure 7A:
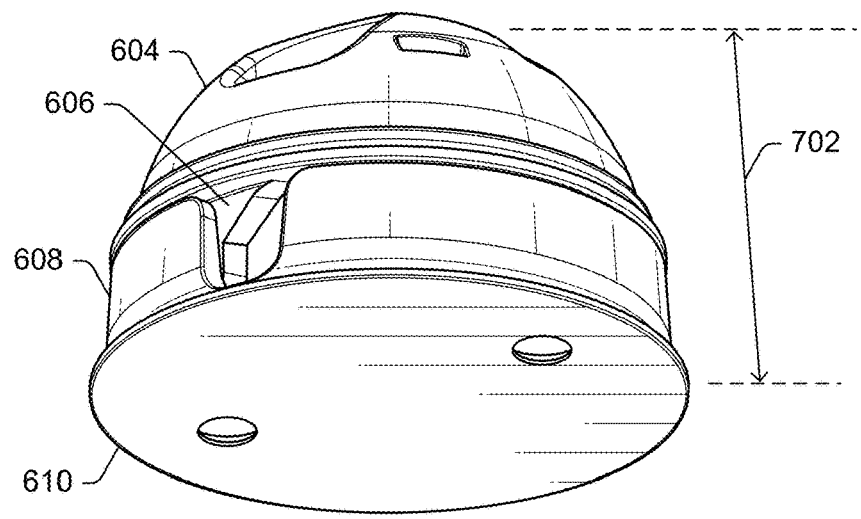
FIG. 7A illustrates an example implementation of a portion of the stand assembly in a first state.
Figure 7B:
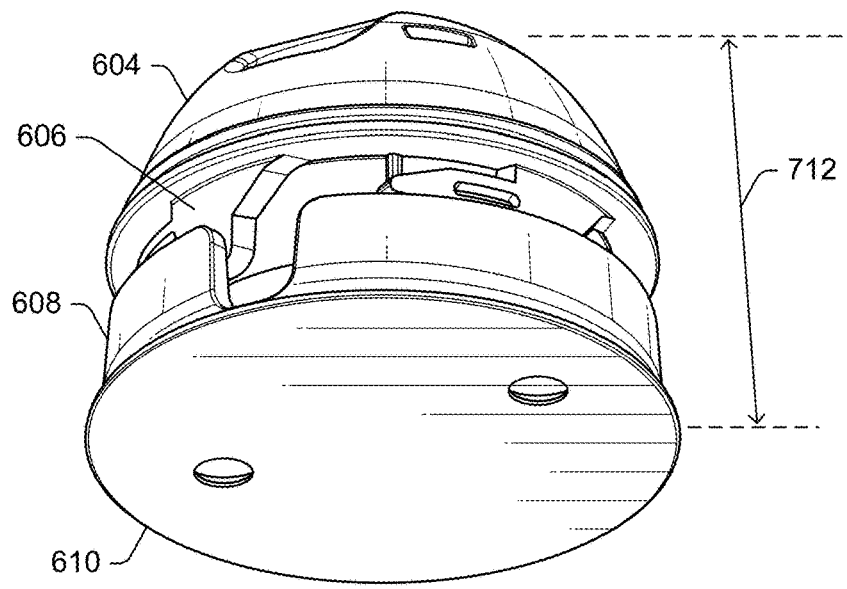
FIG. 7B illustrates an example implementation of a portion of the stand assembly in a second state.

FIG. 7A illustrates an example implementation 700 of a portion of the stand assembly 126 in a first state. FIG. 7B illustrates an example implementation 710 of a portion of the stand assembly 126 in a second state. The example implementations 700 and 710 include an assembly of the weight block 604, the base cap 606, the base plate 608, and the foot 610.

The first state shown in FIG. 7A may be referred to as the tabletop state. The second state shown in FIG. 7B may be referred to as the wall state. The first state has a lower profile than the second state (e.g., height 702 is less than height 712). Accordingly, the wall state increases the height of the stand assembly 126 (and the overall height of the electronic device 100) in comparison to the tabletop state. Further details are described with reference to FIGS. 8A through 11.

Figure 8A:
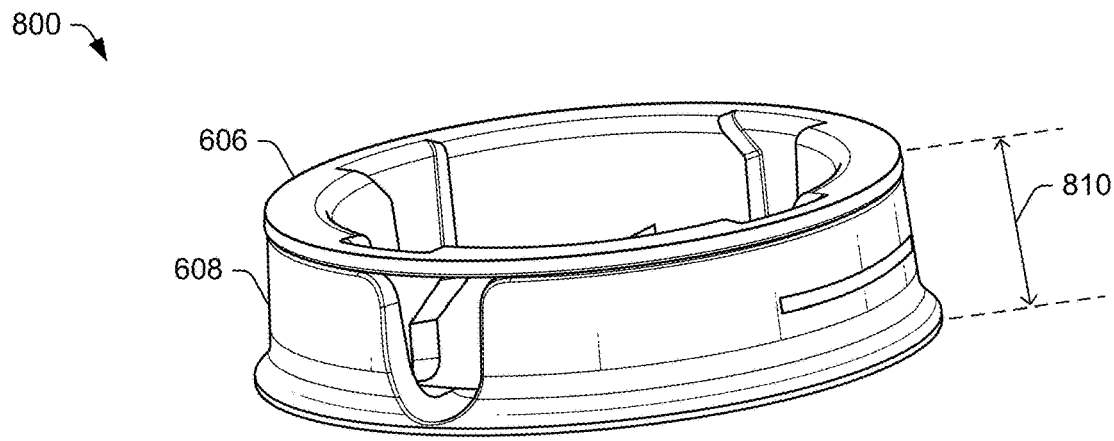
FIG. 8A illustrates an isometric view of the base plate assembled to the base cap in the tabletop state.
Figure 8B:
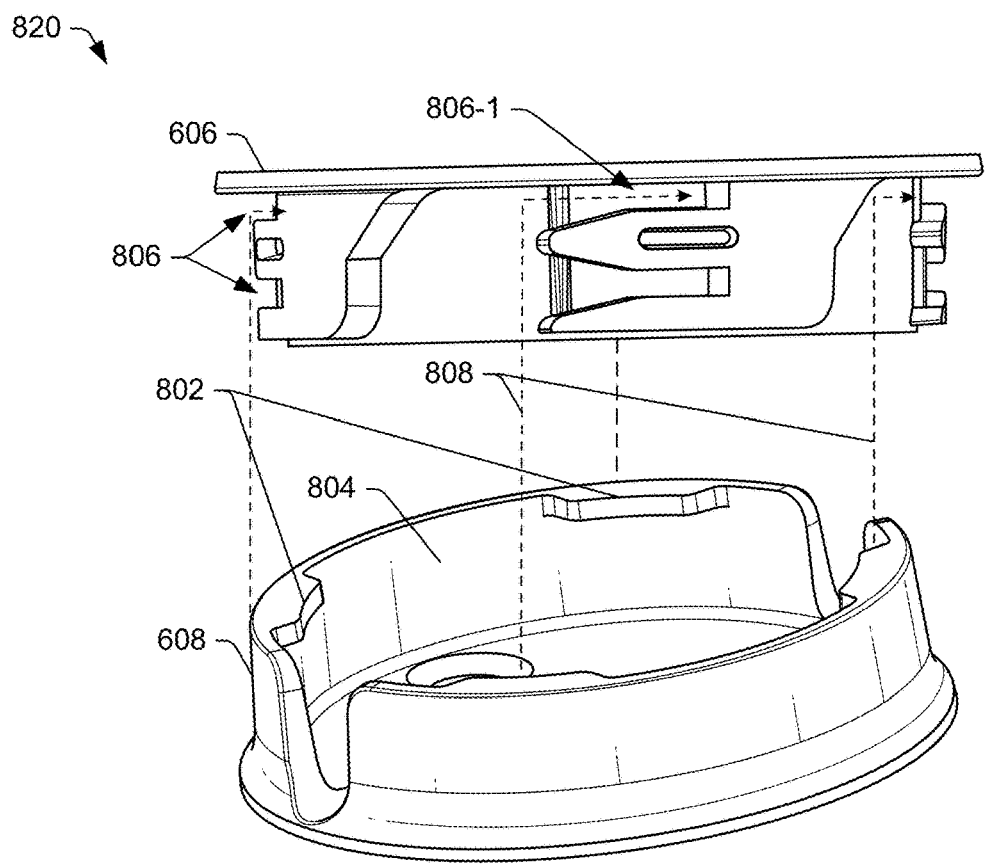
FIG. 8B illustrates an exploded view of the base plate and the base cap relative to the tabletop state.

FIG. 8A illustrates an isometric view 800 of the base plate 608 assembled to the base cap 606 in the tabletop state. FIG. 8B illustrates an exploded view 820 of the base plate 608 and the base cap 606 relative to the tabletop state. The base plate 608 and the base cap 606 may be removably attached to one another via a twist lock (e.g., bayonet-type connector) based on multiple channels mating with multiple protrusions.

In the illustrated example, the base plate 608 includes one or more protrusions 802 (e.g., ribs or pins) that extend from an interior surface 804 of the base plate 608 toward the interior (e.g., cavity 620) of the base plate 608. The protrusions 802 may be distributed around an inner diameter of the base plate 608 in any suitable way, including an even distribution or an uneven distribution. Although the base plate 608 is illustrated as having four ribs, any suitable number of protrusions 802 may be used.

Continuing with the illustrated example, the base cap 606 includes channels 806 (e.g., slots) configured to receive the protrusions 802 to secure the base plate 608 to the base cap 606. At least two of the channels 806 may be formed as part of a recess on an exterior surface of the base cap 606. Alternatively, at least two of the channels 806 may be formed by a protruding member extending from the exterior surface of the base cap 606 and defining the channels 806. The two channels may be orthogonally stacked (parallel to one another and not sharing a longitudinal axis) to provide two different assembly states (e.g., the tabletop state and the wall state) for the stand assembly 126. In particular, the channels enable the base plate 608 to provide different heights for different states of the stand assembly 126. Although not shown, an alternative implementation may include the base plate 608 having channels configured to receive protrusions on the base cap 606.

Inserting the protrusions 802 of the base plate 608 into a first channel 806-1 (e.g., channel 806 nearest to a top of the base cap 606), as illustrated by dashed arrows 808, configures the stand assembly 126 in the tabletop state, which provides a low-profile base for the electronic device 100 having a height 810. The tabletop state may be used for tabletop or shelf mounting locations, or another generally horizontal surface.

Figure 9A:
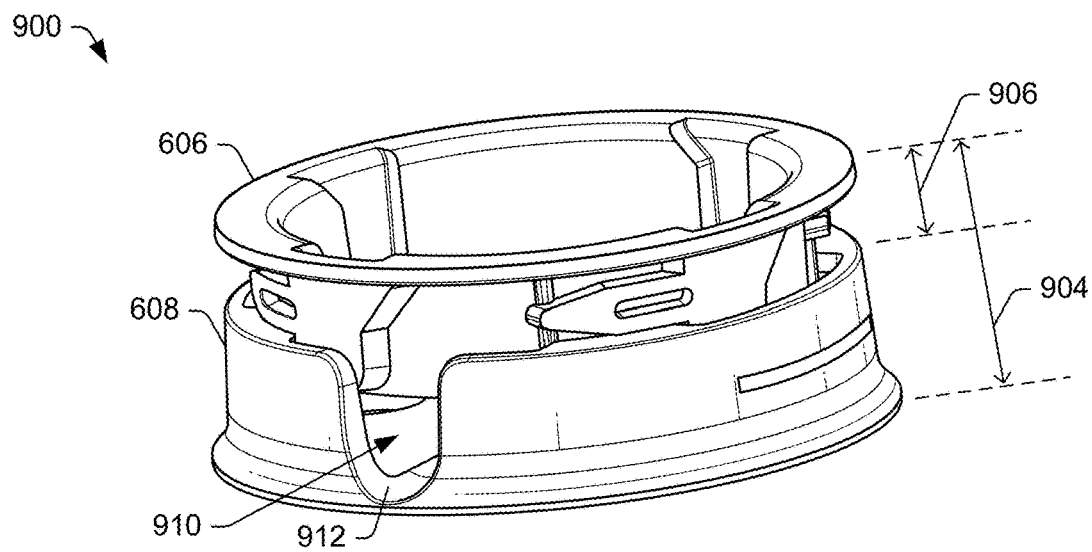
FIG. 9A illustrates an isometric view of the base plate assembled to the base cap in the wall state.
Figure 9B:
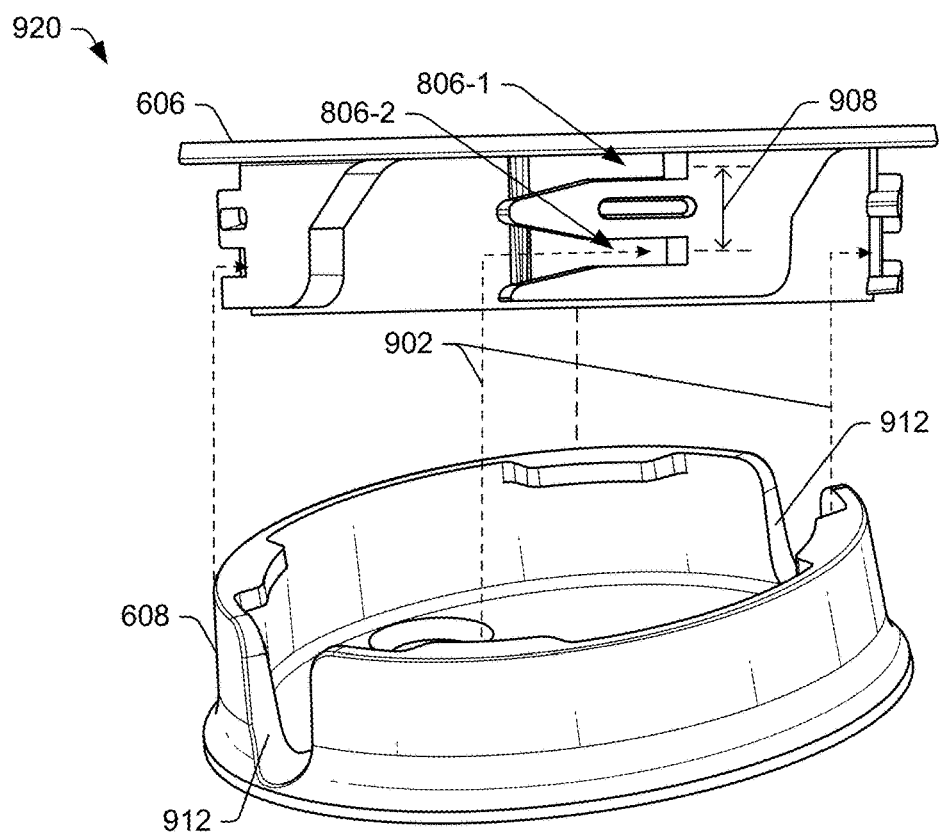
FIG. 9B illustrates an exploded view of the base plate and the base cap relative to the wall state.

Consider now FIG. 9A, which illustrates an isometric view 900 of the base plate 608 assembled to the base cap 606 in the wall state. FIG. 9B illustrates an exploded view 920 of the base plate 608 and the base cap 606 relative to the wall state. Inserting the protrusions 802 of the base plate 608 into a second channel 806-2 (e.g., channel 806 nearest a bottom of the base cap 606), as illustrated by dashed arrows 902, configures the stand assembly 126 in the wall state, which provides a high-profile base for the electronic device 100 having a height 904. By comparison, the height 904 of the high-profile base in the wall state (FIG. 9A) is greater than the height 810 of the low-profile base in the tabletop state (FIG. 8A) by an amount (e.g., distance 906) defined by an offset (e.g., distance 908) between the second channel 806-2 and the first channel 806-1. The greater height (e.g., height 904) of the wall state provides additional clearance between the head assembly 412 and the wall (e.g., the wall 514) when the electronic device 100 is assembled to the wall.

Notice the wall state provides additional space (e.g., volume 910) between the base cap 606 and the base plate 608, which is accessible via cutouts (e.g., notches 912) on opposing sides of the base plate 608. In the wall state, the volume 910 and the notches 912 provide a path for the cable 124 (shown in FIG. 2) to be routed. An example of this is shown in FIGS. 10 and 11.

Figure 10:
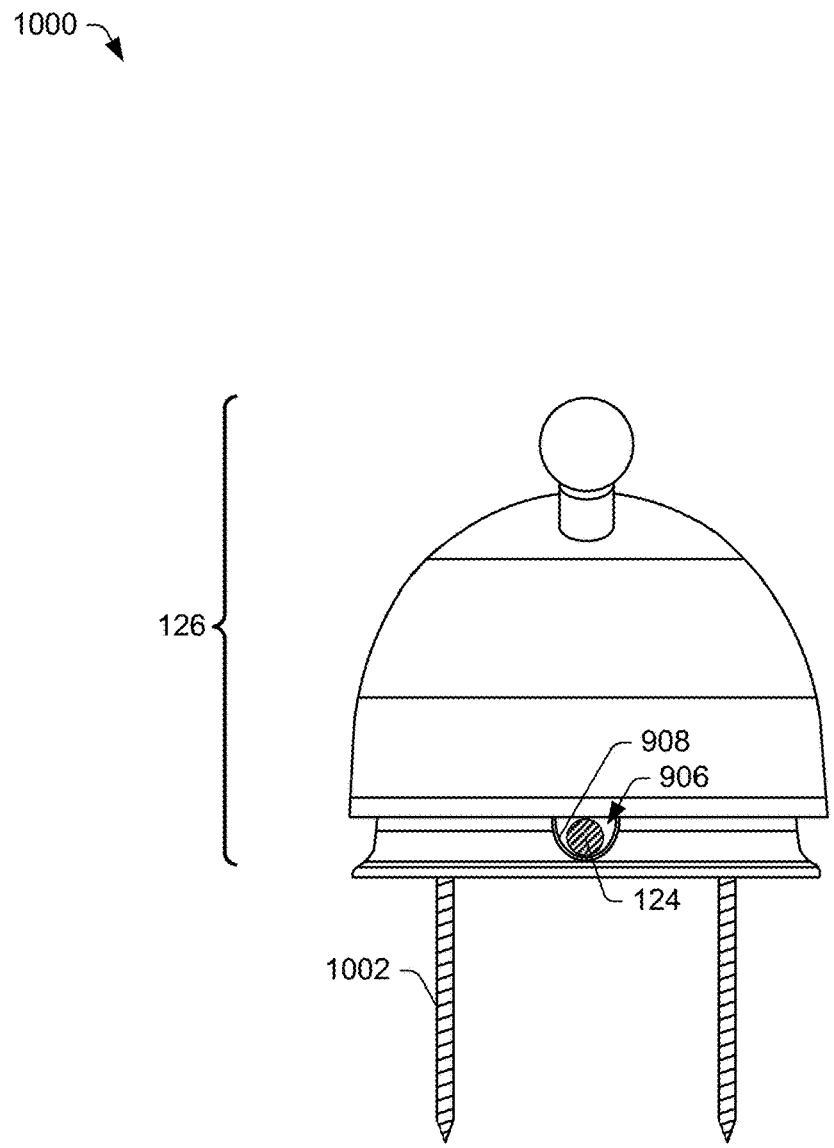
FIG. 10 shows a front elevational view of the stand assembly configured in the wall state.

For example, FIG. 10 shows a front elevational view 1000 of the stand assembly 126 configured in the wall state. As illustrated, the cable 124 is routed through the notches 912 and the volume 910 provided by the wall state. The stand assembly 126 may also include one or more fasteners 1002

(e.g., screws, bolts) for mounting the stand assembly 126 to an inclined surface (e.g., the wall 514 in FIG. 5). For example, the fasteners 1002 may be fitted through holes in the base plate 608 to secure the base plate 608 to the wall.

Figure 11:
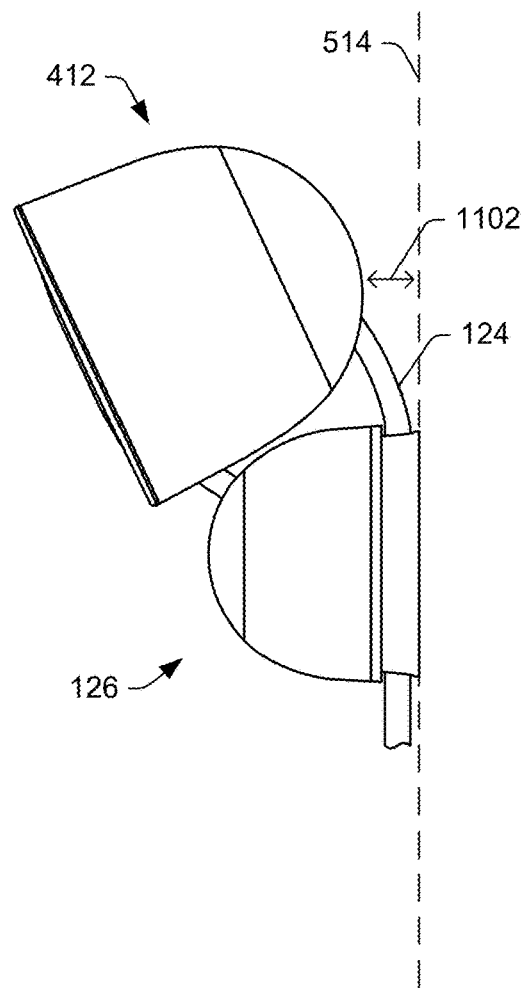
FIG. 11 illustrates a right elevational view showing a profile of the electronic device configured in the wall state and affixed to a wall.

Continuing, FIG. 11 illustrates a right elevational view 1100 showing a profile of the electronic device 100 configured in the wall state and affixed to a wall (e.g., the wall 514). As illustrated, the wall state of the stand assembly 126 provides additional clearance (e.g., distance 1102) between the head assembly 412 and the wall 514 to prevent the head assembly 412 from contacting the wall 514 and also to enable more articulation of the head assembly 412 when the electronic device 100 is in the wall state. By comparison, if the electronic device 100 were mounted to the wall 514 when configured in the tabletop state, the head assembly 412 and/or the cable 124 may bump against the wall 514, resulting in less articulation (e.g., a reduced range of tilt) of the head assembly 412. Also, the cable 124 is routed through the stand assembly 126 to provide a cleaner assembly when the stand assembly 126 is affixed to the wall 514. Routing the cable 124 through the stand assembly 126, as shown in FIGS. 10 and 11, hides a portion of the cable 124 and also constrains the cable 124.

Figure 12A:
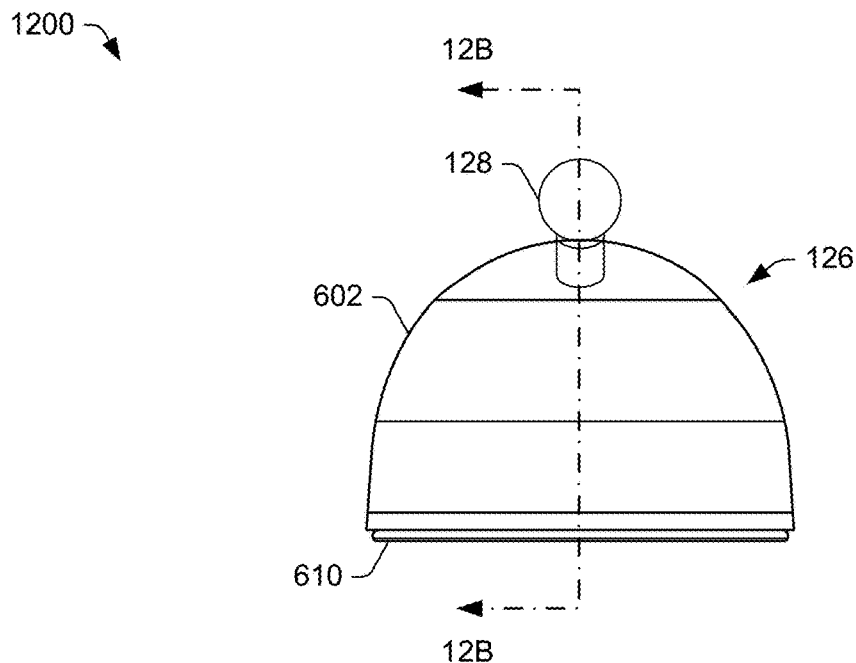
FIG. 12A illustrates a front elevational view of the stand assembly configured in the tabletop state.
Figure 12B:
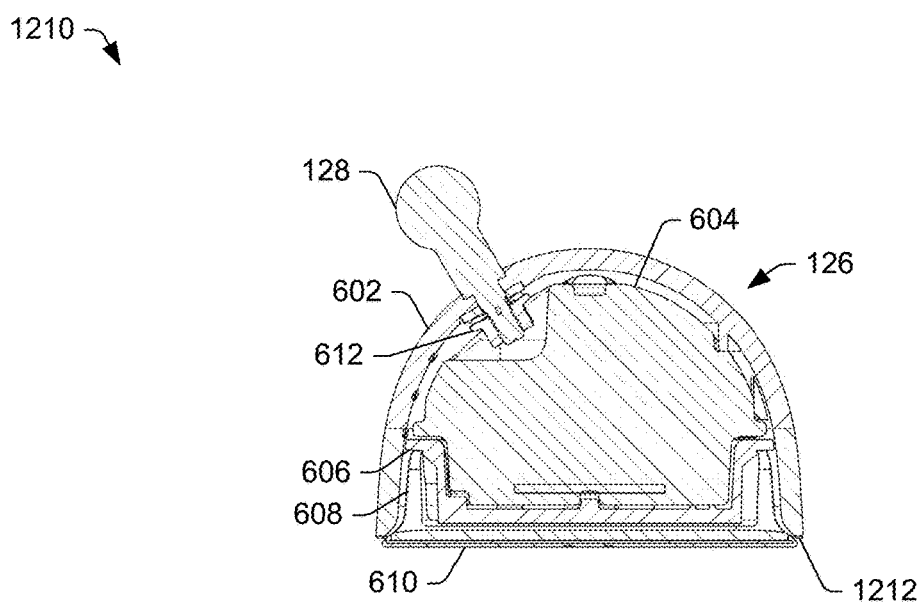
FIG. 12B illustrates a right sectional view of the stand assembly from FIG. 12A, taken along the line 12B-12B.

FIG. 12A illustrates a front elevational view 1200 of the stand assembly 126 configured in the tabletop state. FIG. 12B illustrates a right sectional view 1210 of the stand assembly 126 from FIG. 12A, taken along the line 12B-12B. As shown in the illustrated examples and as described above, the stem 128 is secured to the base housing member 602 by the threaded fastener 612, which is positioned within the base housing member 602. In another example, the stem 128 may be attached directly to the weight block 604 via, e.g., a threaded insert in the weight block 604. The weight block 604 fits within the base housing member 602 and is shaped to substantially complement the shape of the inner surface of the base housing member 602. A portion of the weight block 604 is positioned within the base cap 606. The base plate 608 removably assembles to the base cap 606, within the base housing member 602, in a twist-lock fashion that provides a low profile in the tabletop state where the base plate 608 is substantially flush with an opening of the base housing member 602 (e.g., the opening provided by edges 1212 of the dome-shaped shell).

Figure 13:
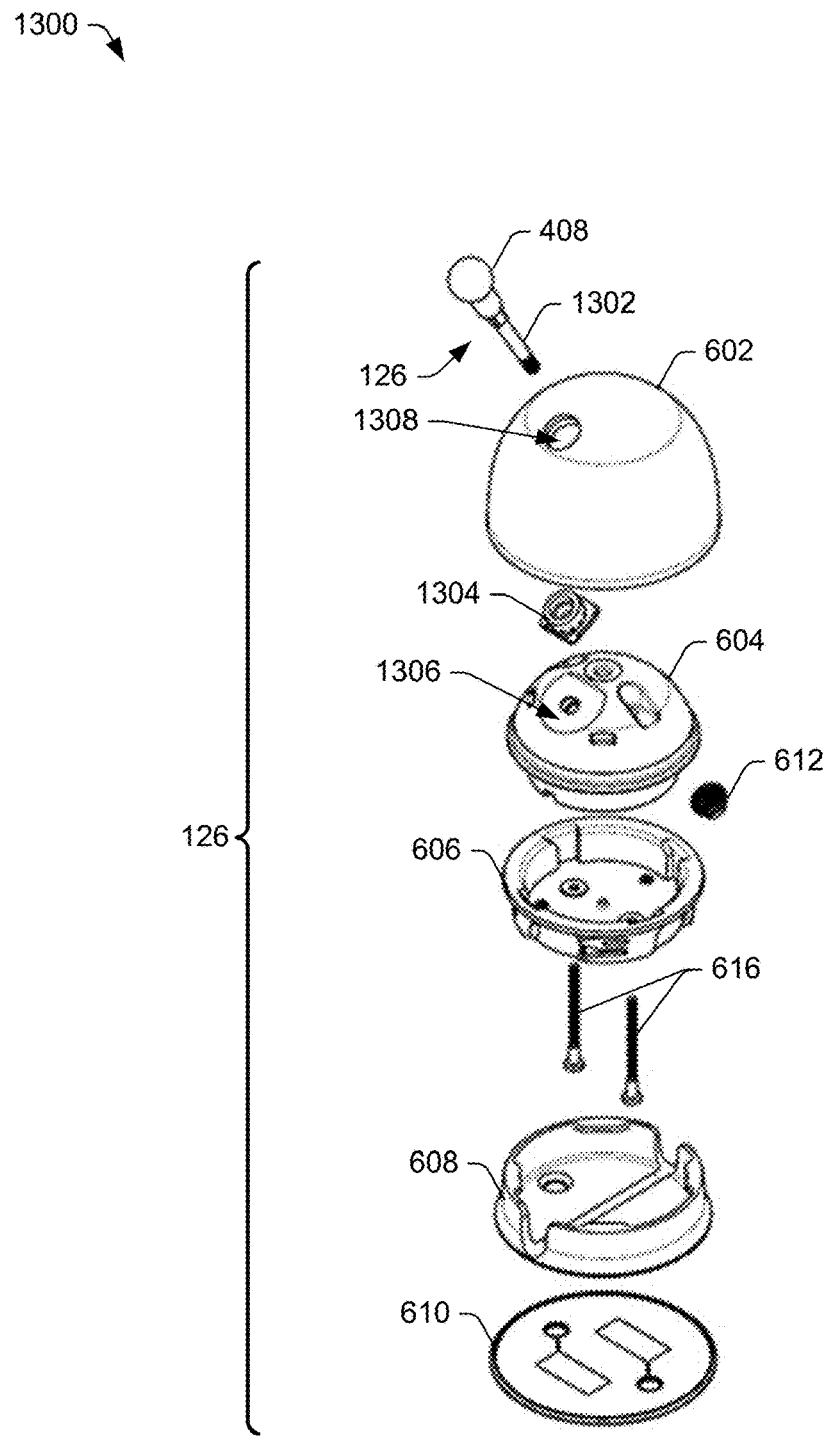
FIG. 13 illustrates an example exploded view of another configuration of the stand assembly.

FIG. 13 illustrates an example exploded view 1300 of another configuration of the stand assembly 126. This configuration may be implemented to accommodate different materials for the base housing member 602 that are less structurally sound than, e.g., plastic, and/or may fail or crack upon impact (e.g., dropping to the floor). Example materials may include wood, ceramic, foam, and so forth. Due to the base housing member 602 having a low structural integrity (e.g., the base housing member 602 is susceptible to cracking based on an impact force caused by the electronic device 100 falling onto a hard surface) in comparison to a plastic material, the stem 128 is not secured to the base housing member 602. Rather, the stem 128 has an elongated shaft (e.g., shaft 1302 is longer than the shaft 406 in FIG. 4) that is inserted through a hole in the weight block and fastened to a threaded fastener (e.g., the threaded fastener 612) on an opposing side of the weight block 604.

In the illustrated example, a spacer (e.g., spacer 1304) may be positioned between the weight block 604 and the first end 408 (e.g., spherical end) of the stem 128, where the shaft 1302 passes through the spacer 1304. The spacer 1304 may be any suitable material, including a flexible silicone or a rigid plastic or metal. Using a flexible silicone or similar material may reduce the overall weight of the electronic device 100 and reduce strain applied to the base housing member 602 by the stem 128. The weight block 604 may include a surface (e.g., surface 1306) configured to support the spacer 1304. Further, the base housing member 602 includes a hole 1308 for the stem 128 to pass through. In aspects, the hole 1308 has a diameter substantially matching an outer diameter of the spacer 1304. In this way, the base housing member 602 does not experience compression forces proximate to the hole 1308 because the base housing member 602 is not compressed between the stem 128 and the spacer 1304. Accordingly, the illustrated configuration of the stand assembly 126 may help reduce strain on the base housing member 602 caused by the stem 128. Also illustrated in FIG. 13 is the base cap 606, the base plate 608, the foot 610, and the fasteners 616.

Figure 14A:
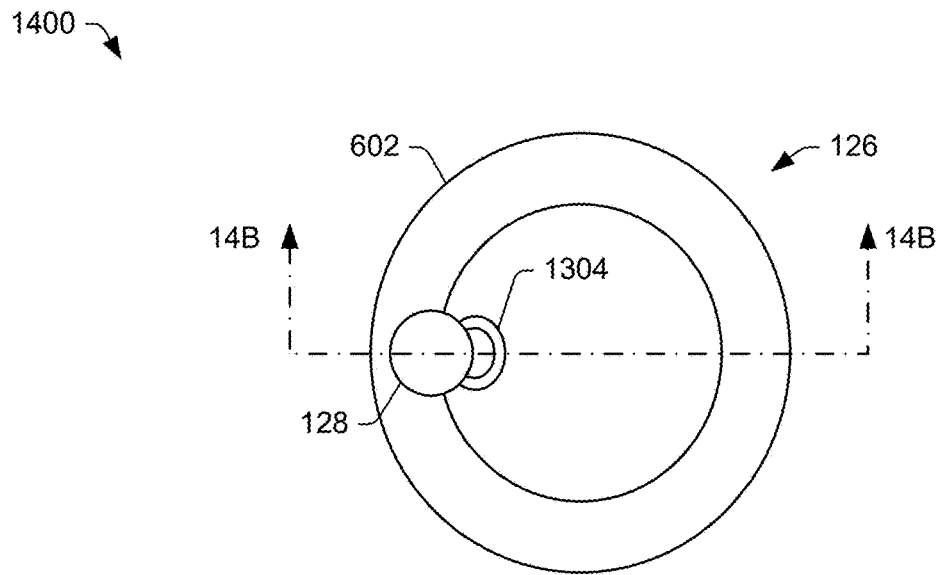
FIG. 14A illustrates a top plan view of the stand assembly from FIG. 13.
Figure 14B:
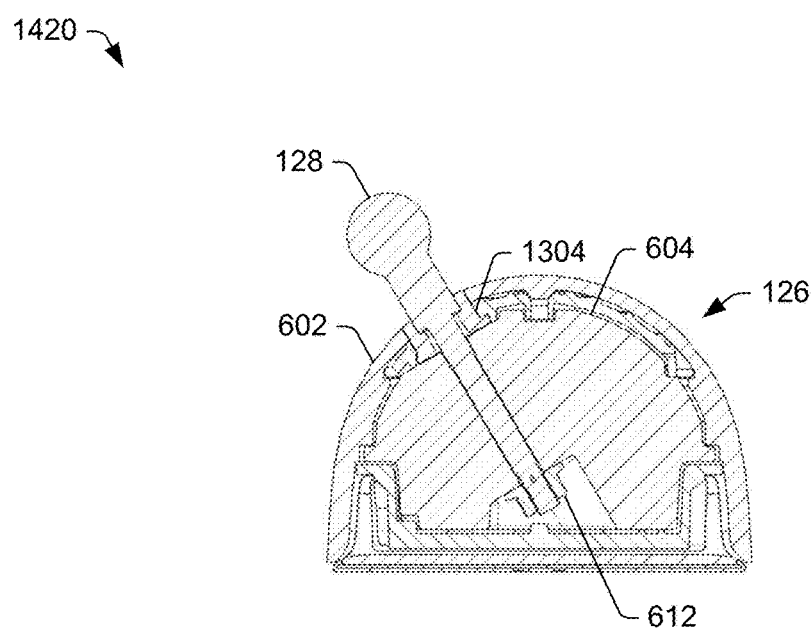
FIG. 14B illustrates a right sectional view of the stand assembly from FIG. 14A, taken along the line 14B-14B.

Continuing the above example, FIG. 14A illustrates a top plan view 1400 of the stand assembly 126 from FIG. 13. FIG. 14B illustrates a right sectional view 1420 of the stand assembly 126 from FIG. 14A, taken along the line 14B-14B. FIG. 14A illustrates the stand assembly 126 as having a generally elliptical shape, viewed from a top view. As illustrated in FIG. 14B, the stem 128 is secured to the weight block 604, and not to the base housing member 602, via the threaded fastener 612. Further, the spacer 1304 is substantially flush with an exterior surface of the base housing member 602. The base housing member 602 may be attached to the weight block 604 in any suitable way that reduces strain on the base housing member 602. For example, the housing may be attached to the weight block 604 via biasing forces between an inner surface of the base housing member 602 and an outer surface of the weight block 604. In some aspects, the base housing member 602 may "snap-fit" onto the weight block 604.

Example Front Cover

Figure 15A:
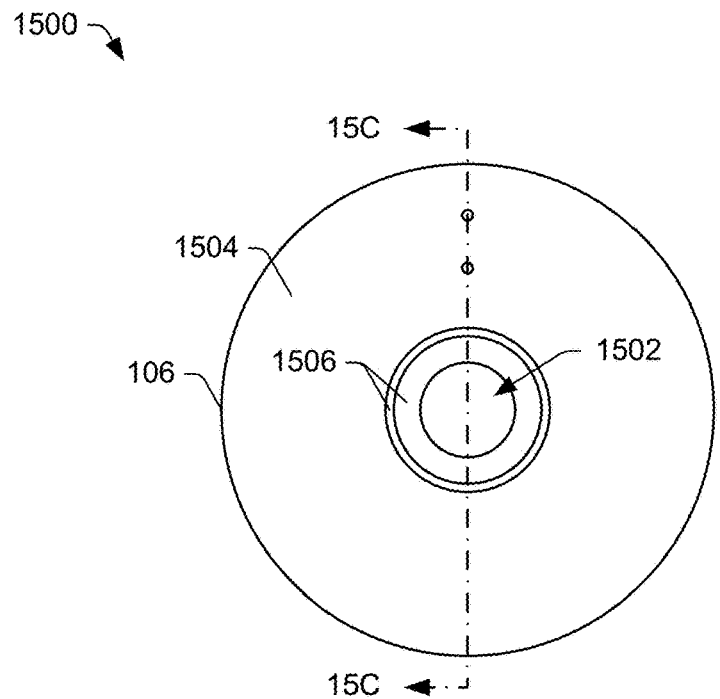
FIG. 15A illustrates a front elevational view of the front housing member.
Figure 15B:
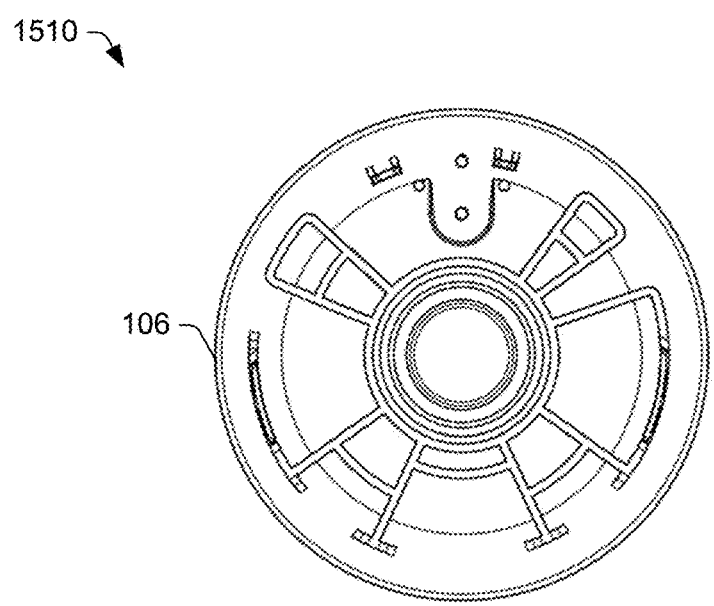
FIG. 15B illustrates a rear elevational view of the front housing member.
Figure 15C:
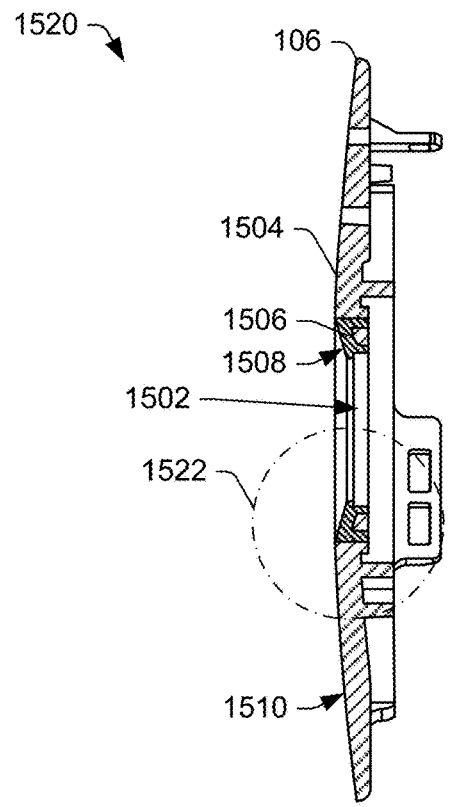
FIG. 15C illustrates a sectional view of the front housing member from FIG. 15, taken along line 15C-15C.
Figure 15D:
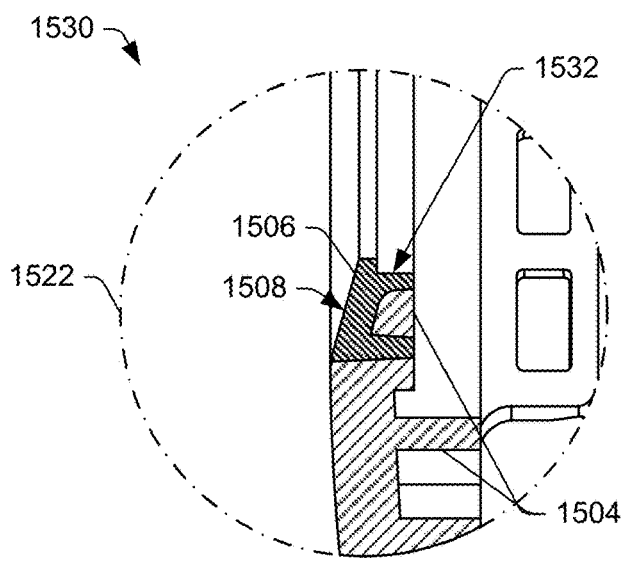
FIG. 15D illustrates an enlarged view of a portion of the sectional view of the front housing member in FIG. 15C.

FIGS. 15A through 15D illustrate different views of a front cover (e.g., the front housing member 106) of the electronic device 100 in FIG. 1. FIG. 15A illustrates a front elevational view 1500 of the front housing member 106. FIG. 15B illustrates a rear elevational view 1510 of the front housing member 106. FIG. 15C illustrates a sectional view 1520 of the front housing member 106 in FIG. 15A, taken along line 15C-15C. FIG. 15D illustrates an enlarged view 1530 of a portion of the sectional view 1520 of the front housing member 106 in FIG. 15C.

The front housing member 106 described herein includes a reduced number of parts in comparison to many existing camera products, which generally include a multi-part architecture having a large cosmetic part with several smaller components located proximate to the lens for different cosmetic looks and for preventing IR glare. IR glare includes IR light coupling into the material of the front cover, traveling along the cover, and leaking into the camera lens. This IR glare causes blur in the image. Some existing camera products include a separate part (e.g., bezel) positioned around the camera lens along with a plurality of additional silicon seals used to prevent the IR leakage.

In contrast to the existing camera products that have a bezel and additional silicon seals, the front housing member 106 described herein is formed of a double-shot molding that prevents IR leakage (e.g., IR glare) into the camera lens without using a separate bezel and/or additional silicon seals. This double-shot molding reduces the number of parts used for the front cover, provides easier control of the parts, and reduces the number of gaps that need to be controlled.

As illustrated in FIG. 15A, the front housing member 106 has a generally elliptical (e.g., circular) shape with a concentrically positioned center opening 1502 that is configured to be aligned with the camera lens (e.g., lens of camera subassembly 112 in FIG. 1). The front housing member 106 includes a single piece having a first material 1504 and a second material 1506 bonded together chemically. In aspects, the front housing member 106 is formed via injection molding, in particular double-shot molding, which enables two plastic resins (e.g., the first material 1504 and the second material 1506) to form a molecular bond to one another, which may provide a seamless and gapless transition between the two materials. The first material 1504 is an IR translucent material, which enables IR light to pass through the first material 1504. For example, the first material 1504 may be positioned in front of an IR light source and IR light (e.g., for night vision or face recognition) from the IR light source may pass through the first material 1504. The second material 1506 is an IR opaque material, which blocks or prevents IR light from passing through the second material 1506. The second material 1506 surrounds the perimeter of the camera lens and thus prevents IR glare into the camera lens. In this way, the second material 1506 acts as an IR-blocking bezel for IR glare prevention. The front housing member 106 has a front surface that is non-planar in order to mitigate interference with a the field of view 510 (in FIG. 5) of the camera subassembly 112 (in FIG. 1) and enhance the field of view of IR illuminators and IR sensors located within the rear housing member 108 and proximate to a backside of the front housing member 106. Further, as illustrated in FIG. 15C, the second material 1506 includes an outer surface 1508 that slopes inward toward the center opening 1502 to reduce interference with the field of view of the camera lens. The first material 1504 includes an exterior surface 1510 that slopes outward toward the second material 1506 (e.g., toward the center opening 1502) A portion 1522 of the sectional view 1520 in FIG. 15C is enlarged and shown in FIG. 15D.

As illustrated in FIG. 15D, the first material 1504 and the second material 1506 are bonded together, resulting in zero gap (e.g., no gap) between the first material 1504 and the second material 1506. In some examples, the double-shot molding leaves no seam or line between the first material 1504 and the second material 1506. The IR light may bounce around in the IR translucent material (e.g., the first material 1504) until meeting the IR opaque material (e.g., the second material 1506), which stops the IR light from passing further and leaking into the camera lens (e.g., a camera lens of the camera subassembly 112 aligned with the center opening 1502 of the front housing member 106). Also, the second material 1506 includes an alignment surface 1532 on an inner diameter of the second material, where the surface is used to align the front housing member 106 with the camera lens of the camera subassembly 112. In addition, the front housing member 106 described herein provides enhanced perceived quality by eliminating the cosmetic gap between the typical multi-part (e.g., 2-part) architecture of many existing devices, which also may reduce manufacturing costs.

Some examples are provided below:

One example includes a camera device comprising: a head assembly including: a rear housing member having a general cup shape with an open end and an opposing, rounded, closed end; a front housing member having a general disk-like shape, the front housing member configured to cover the open end of the head assembly; and a camera subassembly positioned within the rear housing member, the camera subassembly aligned with an aperture or transparent region in the front housing member to enable capture of images or video of a scene; and a stand assembly including: a base housing member forming a dome-shaped shell; a weight block positioned within the base housing member; and a stem configured to provide a hinge connecting the stand assembly to the head assembly, the stem configured to substantially provide a 45-degree range of tilt and a 360-degree range of pan of the head assembly relative to the stand assembly.

The stem may include a first end connected to the head assembly on a lateral side of the rear housing member and proximate to the open end of the rear housing member.

The first end of the stem may be substantially spherical to provide a ball joint for the head assembly.

The stem may include a second end that is opposite the first end and that is connected to a threaded fastener positioned within the base housing member, the stem including a longitudinal axis that forms a non-orthogonal angle with a central axis of the stand assembly.

The angle may be substantially within a range of 20 degrees to 50 degrees.

The threaded fastener may be positioned between the base housing member and the weight block.

The stem may pass through a hole in the weight block and connect to the threaded fastener on an opposing side of the weight block from the first end.

The stem may include a second end that is opposite the first end and that is connected to the weight block.

The stand assembly may further comprise a base cap having a general cup shape with an open end and a substantially planar closed end, the base cap assembled to the weight block, the weight block positioned between the base cap and the base housing member.

The stand assembly may further comprise a base plate having a general cup shape with an open end and a substantially planar closed end, the base plate assembled to the base cap, the base cap positioned between the weight block and the base plate.

The stand assembly may further comprise a foot attached to a bottom surface of the base plate and configured to provide friction against a surface.

The camera device may further comprise a midframe positioned within the rear housing member and forming a structural frame for the camera device, the midframe configured to structurally support a plurality of components of the camera device.

The camera subassembly may be assembled to the midframe.

The front housing member may be assembled to the midframe.

The front housing member may comprise: a first material that is infrared translucent and positioned in front of an IR light source; and a second material that is opaque to infrared light and positioned between the first material and a camera lens of the camera subassembly, the second material configured to prevent infrared light from passing from the first material into the camera lens.

The front housing member may be formed via a double-shot molding that chemically bonds the first material and the second material together.

The first material and the second material may be bonded together to provide a seamless and gapless transition between the first material and the second material.

The camera device may further comprise: a main logic board assembled to the midframe and positioned between the midframe and a heatsink; a camera board of the camera subassembly, the camera board assembled to the midframe between the main logic board and the front housing member;

and an infrared board assembled to the midframe between the front housing member and the camera board.

The camera device may further comprise: a heatsink positioned proximate to the closed end of the rear housing member, the heatsink defining a cavity; and a speaker module positioned within the cavity defined by the heatsink.

The stand assembly may have a smaller diameter than that of the head assembly.

Another example includes a camera device comprising: a head assembly having at least a camera subassembly for capturing images of a scene; a stand assembly configured to support the head assembly and mount to a surface; and a hinge pivotally connecting the head assembly to the stand assembly, the hinge configured to: provide 360-degree range of pan of the head assembly relative to the stand assembly; enable multiple configuration states for affixing the camera device to different surfaces, the multiple configuration states including a tabletop state for a substantially horizontal surface and a wall state for a substantially vertical surface; and transition between the tabletop state and the wall state based on an approximate 180-degree rotation of the stand assembly about a longitudinal axis of the hinge and relative to the head assembly.

The hinge may be further configured to provide an approximate 45-degree range of tilt of the head assembly relative to the stand assembly in each of the multiple configuration states.

The hinge may be further configured to enable: the tabletop state to have a range of tilt between zero and 45 degrees below a horizontal plane when the stand assembly is resting on or mounted to a substantially horizontal surface; and the wall state to have a range of tilt between 25 and 70 degrees below the horizontal plane when the stand assembly is mounted to a vertical surface.

The hinge may include a stem having a first end connected to a second end by an elongated shaft; and the first end of the stem may have a spherical shape forming the hinge with the head assembly and enabling pivotal movement of the head assembly relative to the stand assembly.

The camera subassembly may be positioned within the head assembly proximate to a front end of the head assembly; and the first end of the stem may be attached to the head assembly at a location that is proximate to the front end.

The second end of the stem may be attached to the stand assembly.

The stand assembly may include a bottom surface that is affixable to the different surfaces; the stand assembly may include a central axis that is normal to the bottom surface; and the stem may include a longitudinal axis that, when assembled to the stand assembly, intersects the central axis of the stand assembly to form a non-orthogonal angle with the central axis.

The non-orthogonal angle may be substantially within a range of 20 degrees to 50 degrees.

The stand assembly may have a domed shape that is generally symmetrical about the central axis.

The head assembly may include front and rear housing members that house the camera subassembly; the rear housing member may have a general cup shape with an open end and a rounded closed end that is opposite the open end; and the front housing member may have a generally disk-like shape and is positioned at the open end of the rear housing member to cover the open end.

The stand assembly may comprise: a base plate having a general cup shape and multiple protrusions distributed around a rim of the base plate; and a base cap having multiple channels configured to receive the multiple protrusions on the base plate, the multiple channels including at least two channels that are parallel with one another and orthogonally stacked to enable a low-profile base for the tabletop state and a high-profile base for the wall state.

The base cap and the base plate may be removably attached via a twist lock based on the multiple protrusions and the at least some of the multiple channels.

The high-profile base for the wall state may have a greater height than the low-profile base for the tabletop state.

The base plate may comprise at least two notches on opposing sides of the base plate; the high-profile base may provide a volume between the base plate and the base cap; and the camera device may comprise a cable that is routed through the at least two notches and the volume to constrain the cable.

When the camera device is affixed to the surface, the wall state may provide additional clearance between the head assembly and the surface to prevent the head assembly from contacting the surface.

Yet another example includes An electronic device comprising: a head assembly comprising: a rear housing member, the rear housing member: forming a general cup shape that is generally symmetrical about a first central axis and has an open end and a rounded cap opposite the open end; and having a tapering diameter that tapers from the open end to the rounded cap; and a front housing member assembled at the open end of the rear housing member to cover the open end, the front housing member having a general disk-like shape and being aligned with a camera lens of a camera of the electronic device located within the rear housing member; a stem having an elongated and cylindrical shaft with opposing first and second ends, the first end of the stem being attached to the head assembly through a hole located on a lateral side of the rear housing member and proximate to the open end of the rear housing member, the first end of the stem forming a hinge with the head assembly to enable pivotal movement of the head assembly relative to the stem; and a stand assembly having a domed shape that is generally symmetrical about a second central axis and having a substantially planar bottom surface, the stand assembly attached to the second end of the stem at a location on the stand assembly that is offset from the second central axis of the stand assembly to cause the stem to form a non-orthogonal angle with the second central axis of the stand assembly.

The front surface of the front housing member may be non-planar.

The front housing member may include an opening that is concentric with the front housing member and aligned with the camera lens.

The front housing member may include a first material and a second material that is different than the first material.

The second material may form a perimeter around the opening and may include an outer surface that slopes inward toward the opening.

The first material may include an exterior surface that slopes outward toward the second material.

The first material may be infrared translucent and the second material may be infrared opaque.

The electronic device may further comprise a power cable connected to the head assembly via an aperture located in the rounded cap of the rear housing member.

The rear housing member may define one or more holes in the rounded cap to provide a path for audio waves, generated by a speaker module located within the rear housing member, to exit the head assembly.

The bottom surface may have a diameter that is less than a diameter of the front housing member.

The first end of the stem may be spherical and secured within the head assembly to enable the pivotal movement of the head assembly relative to the stem.

The pivotal movement of the head assembly relative to the stem may include pan and tilt.

The hinge may enable a first position of the head assembly relative to the stand assembly, the first position including the central axis of the rear housing member of the head assembly being substantially parallel to a plane defined by the bottom surface of the stand assembly.

The hinge may enable a second position of the head assembly relative to the stand assembly, the second position including the central axis of the rear housing member being substantially orthogonal to a longitudinal axis of the stem.

The stand assembly may include a removably assembled base plate that provides different heights for different states of the stand assembly; the different heights include: a first height for a tabletop state of the stand assembly; and a second height for a wall state of the stand assembly, the second height being greater than the first height; and the base plate, when assembled in the wall state, defines a volume and provides a path to route a power cable of the electronic device through the volume to hide and constrain a portion of the power cable within the volume.

What is claimed is:

1. An electronic device comprising:
    a head assembly comprising:
        a rear housing member, the rear housing member forming a general cup shape that has a first central axis, an open end, and a cap opposite the open end; and
        a front housing member assembled at the open end of the rear housing member to cover the open end, the front housing member being aligned with a camera lens of a camera of the electronic device located within the rear housing member;
    a stem having an elongated shaft with opposing first and second ends, the first end of the stem being coupled to the head assembly, the stem inserted through a first hole located on a lateral side of the rear housing member between the open end and the cap and located proximate to the open end of the rear housing member such that the first end of the stem is positioned closer to the open end than to the cap of the rear housing member, the first end of the stem forming a hinge with the head assembly to enable pivotal movement of the head assembly relative to the stem; and
    a stand assembly having a domed shape that is generally symmetrical about a second central axis and having a substantially planar bottom surface, the stand assembly attached to the second end of the stem, the second end of the stem inserted through a second hole located on the stand assembly at an attachment location that is offset from the second central axis of the stand assembly to cause the stem to form a non-orthogonal angle with the substantially planar bottom surface of the stand assembly.

2. The electronic device of claim 1, wherein the front housing member includes a front surface that is non-planar.

3. The electronic device of claim 1, wherein the front housing member includes an opening that is concentric with the front housing member and aligned with the camera lens.

4. The electronic device of claim 3, wherein the front housing member includes a first material and a second material that is different than the first material.

5. The electronic device of claim 4, wherein the second material forms a perimeter around the opening and includes an outer surface that slopes inward toward the opening.

6. The electronic device of claim 4, wherein the first material includes an exterior surface that slopes outward toward the second material.

7. The electronic device of claim 4, wherein the first material is infrared translucent and the second material is infrared opaque.

8. The electronic device of claim 1, further comprising a power cable connected to the head assembly via an aperture located in the cap of the rear housing member.

9. The electronic device of claim 1, wherein the rear housing member defines one or more holes in the cap to provide a path for audio waves, generated by a speaker module located within the rear housing member, to exit the head assembly.

10. The electronic device of claim 1, wherein the substantially planar bottom surface has a diameter that is less than a diameter of the front housing member.

11. The electronic device of claim 1, wherein the first end of the stem is spherical and secured within the head assembly to enable the pivotal movement of the head assembly relative to the stem.

12. The electronic device of claim 11, wherein the pivotal movement of the head assembly relative to the stem includes pan and tilt.

13. The electronic device of claim 1, wherein the hinge enables a first position of the head assembly relative to the stand assembly, the first position including the first central axis of the rear housing member of the head assembly being substantially parallel to a plane defined by the substantially planar bottom surface of the stand assembly.

14. The electronic device of claim 13, wherein the hinge enables a second position of the head assembly relative to the stand assembly, the second position including the first central axis of the rear housing member being substantially orthogonal to a longitudinal axis of the stem.

15. The electronic device of claim 1, wherein:
    the stand assembly includes a removably assembled base plate that provides different heights for different states of the stand assembly;
    the different heights include:
        a first height for a tabletop state of the stand assembly; and
        a second height for a wall state of the stand assembly, the second height being greater than the first height; and
    the removably assembled base plate, when assembled in the wall state, defines a volume and provides a path to route a power cable of the electronic device through the volume to hide and constrain a portion of the power cable within the volume.

16. The electronic device of claim 15, wherein the hinge is configured to provide an approximate 45-degree range of tilt of the head assembly relative to the stand assembly in each of the different states of the stand assembly.

17. The electronic device of claim 15, wherein the hinge is configured to enable:
    the tabletop state to have a range of tilt between zero and 45 degrees below a horizontal plane when the stand assembly is resting on or mounted to a substantially horizontal surface; and
    the wall state to have a range of tilt between 25 and 70 degrees below the horizontal plane when the stand assembly is mounted to a vertical surface.

18. The electronic device of claim 1, wherein the hinge is configured to provide 360-degree range of pan of the head assembly relative to the stand assembly.

19. The electronic device of claim 1, further comprising the camera, wherein the camera is positioned within the head assembly and proximate to the open end of the rear housing member.

20. The electronic device of claim 1, wherein:
- the stem includes a longitudinal axis that forms the non-orthogonal angle with the substantially planar bottom surface of the stand assembly; and
- the longitudinal axis is orthogonal to an exterior surface of the stand assembly at the attachment location on the stand assembly.

\* \* \* \* \*